US 11,393,847 B2

(12) United States Patent
Tsukamoto

(10) Patent No.: US 11,393,847 B2
(45) Date of Patent: Jul. 19, 2022

(54) SEMICONDUCTOR STORAGE APPARATUS, PRODUCT-SUM CALCULATION APPARATUS, AND ELECTRONIC EQUIPMENT

(71) Applicant: SONY SEMICONDUCTOR SOLUTIONS CORPORATION, Kanagawa (JP)

(72) Inventor: Masanori Tsukamoto, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 5 days.

(21) Appl. No.: 17/040,685

(22) PCT Filed: Feb. 27, 2019

(86) PCT No.: PCT/JP2019/007412
§ 371 (c)(1),
(2) Date: Sep. 23, 2020

(87) PCT Pub. No.: WO2019/187908
PCT Pub. Date: Oct. 3, 2019

(65) Prior Publication Data
US 2021/0043636 A1     Feb. 11, 2021

(30) Foreign Application Priority Data
Mar. 30, 2018   (JP) ............................ JP2018-069390

(51) Int. Cl.
*H01L 29/66*        (2006.01)
*H01L 29/78*        (2006.01)
(Continued)

(52) U.S. Cl.
CPC ........ *H01L 27/1159* (2013.01); *G11C 11/223* (2013.01); *H01L 27/11587* (2013.01);
(Continued)

(58) Field of Classification Search
CPC .......... H01L 27/11587; H01L 27/1159; H01L 29/78931; H01L 29/42384; H01L 29/516; H01L 29/6684; G11C 11/223
(Continued)

(56) References Cited

U.S. PATENT DOCUMENTS 9,954,004 B2 *   4/2018   Yamazaki ........... H01L 27/1156
2007/0158731 A1*  7/2007   Bae .......................... G11C 11/22
                                                                    257/314
(Continued)

FOREIGN PATENT DOCUMENTS

JP        63-268184 A      11/1988
JP        2001-053164 A     2/2001
(Continued)

OTHER PUBLICATIONS

International Search Report and Written Opinion of PCT Application No. PCT/JP2019/007412, dated May 14, 2019, 11 pages of ISRWO.

*Primary Examiner* — David Vu
*Assistant Examiner* — Brandon C Fox
(74) *Attorney, Agent, or Firm* — Chip Law Group

(57) ABSTRACT

To provide a semiconductor storage apparatus, a product-sum calculation apparatus, and electronic equipment in which memory cells are highly integrated and highly densified. A semiconductor storage apparatus including: a first transistor including a first gate electrode via a ferroelectric film on an activation region including source or drain regions; and a second transistor including source or drain regions in an activation layer provided on the first gate electrode and a second gate electrode on the activation layer via an insulating film.

14 Claims, 21 Drawing Sheets

(51) Int. Cl.
   *G11C 11/22* (2006.01)
   *H01L 27/1159* (2017.01)
   *H01L 27/11587* (2017.01)
   *H01L 29/423* (2006.01)
   *H01L 29/51* (2006.01)

(52) U.S. Cl.
   CPC ...... *H01L 29/42384* (2013.01); *H01L 29/516* (2013.01); *H01L 29/6684* (2013.01); *H01L 29/78391* (2014.09)

(58) Field of Classification Search
   USPC .......................................................... 257/295
   See application file for complete search history.

(56) References Cited

U.S. PATENT DOCUMENTS

| | | | |
|---|---|---|---|
| 2016/0350182 A1 | 12/2016 | Tsutsui | |
| 2017/0301376 A1 | 10/2017 | Kurokawa | |
| 2019/0103493 A1* | 4/2019 | Tu | G11C 11/2273 |
| 2020/0235221 A1* | 7/2020 | Sharma | H01L 21/823857 |
| 2021/0036024 A1* | 2/2021 | Kim | H01L 27/0922 |

FOREIGN PATENT DOCUMENTS

| | | |
|---|---|---|
| JP | 2009-230834 A | 10/2009 |
| JP | 2016-224932 A | 12/2016 |
| JP | 2017-194963 A | 10/2017 |
| TW | 201741942 A | 12/2017 |
| WO | 2017/178947 A1 | 10/2017 |

* cited by examiner

A-A                    B-B

SEMICONDUCTOR STORAGE APPARATUS, PRODUCT-SUM CALCULATION APPARATUS, AND ELECTRONIC EQUIPMENT

CROSS REFERENCE TO RELATED APPLICATIONS

This Applications is a U.S. National Phase of International Patent Application No. PCT/JP2019/007412 filed on Feb. 27, 2019, which claims priority benefit of Japanese Patent Application No. JP 2018-069390 filed in the Japan Patent Office on Mar. 30, 2018. Each of the above-referenced Applications is hereby incorporated herein by reference in its entirety.

TECHNICAL FIELD

The present disclosure relates to a semiconductor storage apparatus, a product-sum calculation apparatus, and electronic equipment.

BACKGROUND ART

A complementary MOS (CMOS) circuit including an n-type metal-oxide-semiconductor field-effect transistor (nMOSFET) and a p-type MOSFET (pMOSFET) provided on the same substrate is known as a circuit that consumes less power, enables high-speed operation, and allows easy miniaturization and high integration.

Therefore, the CMOS circuit is used in many large scale integration (LSI) devices. Note that such an LSI device has been commercialized in recent years as a system on a chip (SoC) in which an analog circuit, a memory, a logic circuit, and the like are mounted together on one chip.

For example, a static random access memory (RAM) or the like is used as a memory mounted on an LSI. In recent years, in order to further reduce the cost and power consumption of LSI devices, it has been considered to use a dynamic RAM (DRAM), a magnetic RAM (MRAM), a ferroelectric RAM (FeRAM), or the like instead of a SRAM.

Here, the FeRAM is a semiconductor storage apparatus that stores information using the direction of remanent polarization of a ferroelectric. As a structure of the FeRAM, for example, there has been proposed a 1 transistor (1T) type structure using a field effect transistor using a ferroelectric material for a gate insulating film as a memory cell.

However, in the FeRAM having the 1T type structure, a plurality of memory cells shares a word line and a bit line. Therefore, in a case where information is written in a memory cell, a voltage is applied not only to the selected memory cell, but also to unselected memory cells sharing a word line or a bit line. Therefore, in the FeRAM having the 1T type structure, when information is written in the memory cell, there is a possibility that the information stored in an unselected memory cell is overwritten.

For example, Patent Document 1 below discloses a ferroelectric memory that enables a voltage to be applied only to a memory cell in which information is written by connecting a selection transistor to the gate of a ferroelectric transistor.

CITATION LIST

Patent Document

Patent Document 1: Japanese Patent Application Laid-Open No. 2009-230834

SUMMARY OF THE INVENTION

Problems to be Solved by the Invention

However, in the ferroelectric memory disclosed in Patent Document 1, since the selection transistor and wiring of the selection transistor are provided for each memory cell, the plane area of each memory cell becomes large. Therefore, in the ferroelectric memory disclosed in Patent Document 1, it has been difficult to achieve high integration and high density of memory cells.

Therefore, the present disclosure proposes a new and improved semiconductor storage apparatus, product-sum calculation apparatus, and electronic equipment capable of reducing the plane area of a memory cell.

Solutions to Problems

According to the present disclosure, there is provided a semiconductor storage apparatus including: a first transistor including a first gate electrode via a ferroelectric film on an activation region including source or drain regions; and a second transistor including source or drain regions in an activation layer provided on the first gate electrode and a second gate electrode on the activation layer via an insulating film.

Furthermore, according to the present disclosure, there is provided a product-sum calculation apparatus including: a first transistor including a first gate electrode via a ferroelectric film on an activation region including source or drain regions; and a second transistor including source or drain regions in an activation layer provided on the first gate electrode and a second gate electrode on the activation layer via an insulating film.

Furthermore, according to the present disclosure, there is provided electronic equipment including: a semiconductor storage apparatus including: a first transistor including a first gate electrode via a ferroelectric film on an activation region including source or drain regions; and a second transistor including source or drain regions in an activation layer provided on the first gate electrode and a second gate electrode on the activation layer via an insulating film.

According to the present disclosure, it is possible to control the presence or absence of occurrence of an electric field with respect to the ferroelectric film of the first transistor by the second transistor provided on the first transistor.

Effects of the Invention

As described above, according to the present disclosure, there are provided a semiconductor storage apparatus, a product-sum calculation apparatus, and electronic equipment in which memory cells are highly integrated and highly densified.

Note that the effects described above are not necessarily limitative. With or in the place of the above effects, there may be achieved any one of the effects described in this specification or other effects that may be grasped from this specification.

MODE FOR CARRYING OUT THE INVENTION

Figure 1:
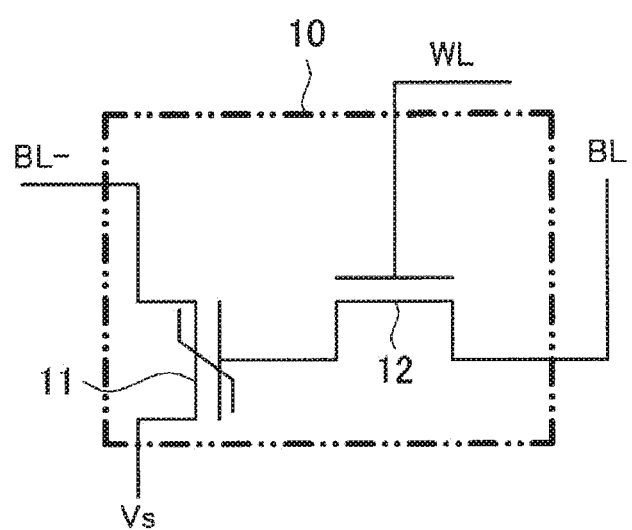
FIG. 1 is a circuit diagram showing an equivalent circuit of a semiconductor storage apparatus according to an embodiment of the present disclosure.

Preferred embodiments of the present disclosure will be described in detail below with reference to the accompanying drawings. Note that, in this description and the drawings, configuration elements that have substantially the same function and configuration are denoted with the same reference numerals, and repeated explanation is omitted.

In each drawing referred to in the following description, the sizes of some constituent members may be exaggerated for the sake of convenience of description. Therefore, the relative sizes of the constituent members illustrated in each drawing do not always accurately represent the magnitude relationship between the actual constituent members. Furthermore, in the following description, the direction in which substrates or layers are stacked may be expressed as the upward direction.

Note that the description is given in the order below.
1. Overview
2. Structural example
3. Manufacturing method
4. Variations
5. Operation example
6. Application example

1. OVERVIEW

First, with reference to FIG. 1, an overview of a semiconductor storage apparatus according to an embodiment of the present disclosure will be described. FIG. 1 is a circuit diagram showing an equivalent circuit of a semiconductor storage apparatus according to the present embodiment.

Note that, in FIG. 1, "gate" represents a gate electrode of a field effect transistor, "drain" represents a drain electrode or a drain region of the field effect transistor, and "source" represents a source electrode or a source region of the field effect transistor.

As shown in FIG. 1, a semiconductor storage apparatus 10 includes a first transistor 11 and a second transistor 12 connected to the gate of the first transistor 11.

The first transistor 11 is a field effect transistor having a gate insulating film including a ferroelectric material. The first transistor 11 stores information in the direction of remanent polarization of the gate insulating film. The first transistor 11 is connected to a second bit line BL− at one of the source and the drain, and is connected to a source line Vs at the other of the source and the drain. Note that the source line Vs may be electrically connected to a power supply VDD or a ground GND.

The second transistor 12 is a field effect transistor having a gate insulating film including, for example, a paraelectric material. The second transistor 12 functions as a switching element that controls voltage application to the gate of the first transistor 11. The second transistor 12 is connected to the gate of the first transistor 11 at one of the source and the drain, and is connected to a first bit line BL at the other of the source and the drain. The gate of the second transistor 12 is connected to a word line WL, and ON/OFF of the second transistor 12 is controlled by voltage application from the word line WL. Note that the second transistor 12 may be a field effect transistor having a gate insulating film including a ferroelectric material.

In a case where information is written in the first transistor 11, the semiconductor storage apparatus 10 first turns on the second transistor 12 by applying a voltage to the word line WL. Next, the semiconductor storage apparatus 10 applies a predetermined potential difference to the first bit line BL and the second bit line BL−, thereby generating an electric field in the gate insulating film (that is, a ferroelectric film) of the first transistor 11. Therefore, the semiconductor storage apparatus 10 can control the direction of the remanent polarization of the gate insulating film of the first transistor 11 by an external electric field and write information in the first transistor 11.

On the other hand, in a case where information is read from the first transistor 11, the semiconductor storage apparatus 10 first turns on the second transistor 12 by applying a voltage to the word line WL. Next, the semiconductor storage apparatus 10 applies a voltage to the first bit line BL to turn on the first transistor 11, and then causes a current to flow between the second bit line BL− and the source line Vs. Since a threshold voltage Vt of the first transistor 11 changes according to the direction of remanent polarization of the gate insulating film, the channel resistance of the first transistor 11 changes according to the direction of remanent polarization of the gate insulating film. Therefore, the semiconductor storage apparatus 10 can read the information stored in the first transistor 11 by measuring the magnitude of the current flowing between the second bit line BL− and the source line Vs.

That is, the semiconductor storage apparatus 10 according to the present embodiment can operate as a ferroelectric random access memory (FeRAM) that stores 1-bit information of 0 or 1 in the first transistor 11.

Here, in the semiconductor storage apparatus 10, since the source or the drain of the second transistor 12 is connected to the gate of the first transistor 11, whether or not an electric field is applied to the gate insulating film of the first transistor 11 can be controlled by controlling the second transistor 12.

Therefore, the semiconductor storage apparatus 10 can selectively apply a voltage to the gate insulating film of the first transistor 11 when writing or reading information, and it is possible to prevent the information stored in the unselected first transistor 11 from being overwritten. Furthermore, the semiconductor storage apparatus 10 can selectively apply an electric field to the gate insulating film of the first transistor 11 when writing or reading information, and it is possible to suppress deterioration of the ferroelectric material constituting the gate insulating film.

Moreover, in the semiconductor storage apparatus 10, the second transistor 12 can be provided on the first transistor by forming the second transistor 12 as a so-called thin film transistor (TFT). According to this, the semiconductor storage apparatus 10 can reduce the plane area of the semiconductor storage apparatus 10 as compared with the case where the first transistor 11 and the second transistor 12 are arranged in a plane.

2. STRUCTURAL EXAMPLE

Figure 2:
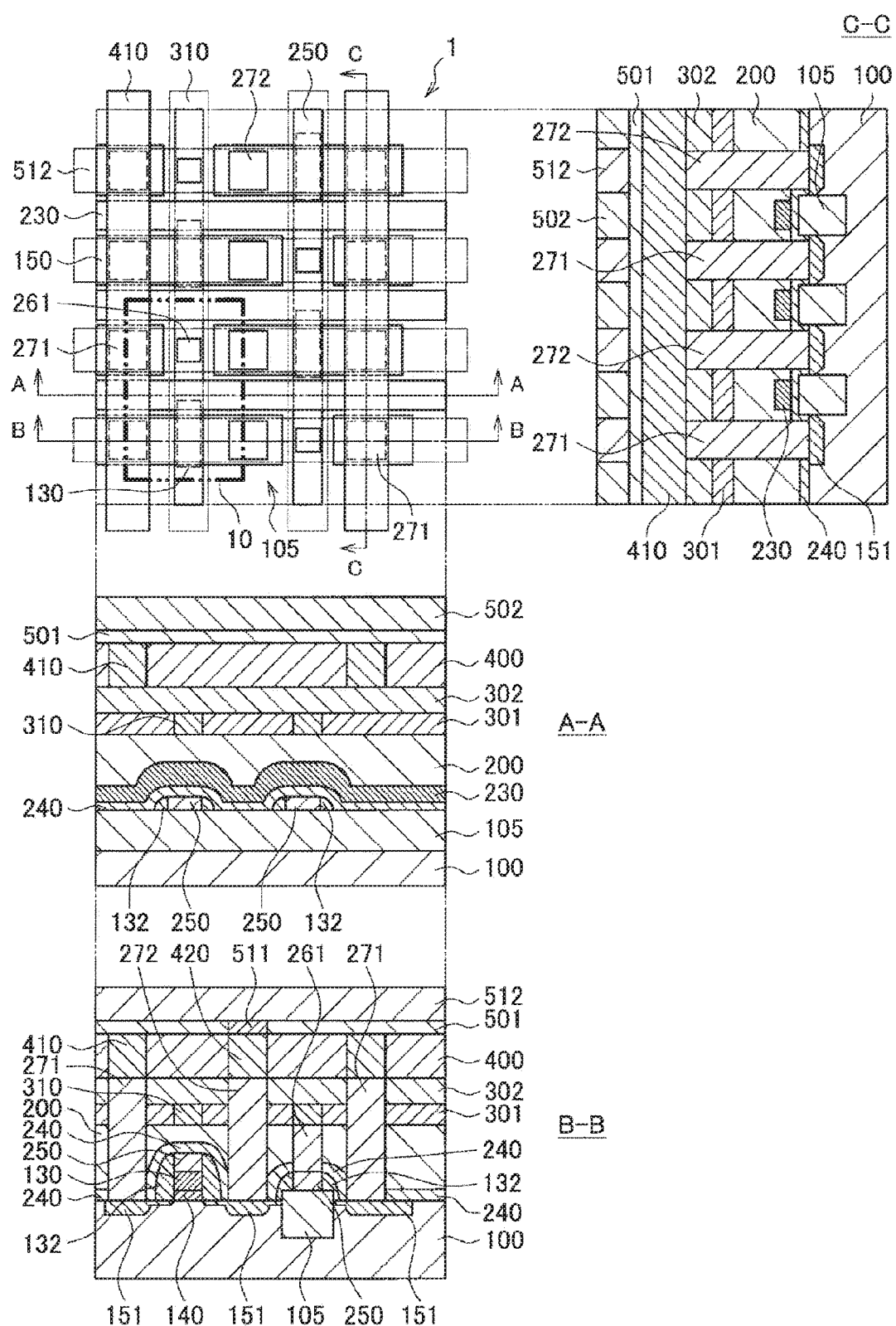
FIG. 2 is a schematic view showing a plane structure and a cross-sectional structure of the semiconductor storage apparatus according to the embodiment.

Next, with reference to FIG. 2, a specific structure of the semiconductor storage apparatus 10 according to the present embodiment will be described. FIG. 2 is a schematic view showing a plane structure and a cross-sectional structure of the semiconductor storage apparatus 10 according to the present embodiment.

Note that, in the plan view of FIG. 2, layers formed over the entire surface of the semiconductor storage apparatus 10 are omitted for the sake of clarity of the arrangement of each configuration, and a plan transparent view is shown. Each of the cross-sectional views in FIG. 2 shows a cross-section obtained by cutting the plan view along each of line A-A, line B-B, or line C-C.

Furthermore, in the following, "first conductivity type" represents one of "p type" and "n type", and "second conductivity type" represents the other of "p type" and "n type" different from the "first conductivity type".

As shown in FIG. 2, a storage apparatus 1 is provided on a semiconductor substrate 100. The storage apparatus 1 is formed by arranging a large number of semiconductor storage apparatuses 10 that stores 1-bit information in a matrix on the semiconductor substrate 100, and stores a large amount of information. In FIG. 2, a region surrounded by a broken line corresponds to one semiconductor storage apparatus 10.

The first transistor 11 includes a ferroelectric film 140 provided on the semiconductor substrate 100, a first gate electrode 130 provided on the ferroelectric film 140, and source or drain regions 151 provided on the semiconductor substrate 100.

One of the source or drain regions 151 of the first transistor 11 is electrically connected to a second wiring layer 410 (source line Vs) extending in a second direction (upward and downward direction when directly facing FIG. 2) via a contact 271. On the other hand, the other of the source or drain regions 151 is electrically connected to a third wiring layer 512 (second bit line BL−) extending in a first direction (right and left direction when directly facing FIG. 2) orthogonal to the second direction via a contact 272 and the second wiring layer 420.

The second transistor 12 includes an activation layer 250 extending in the second direction passing over the first gate electrode 130, a gate insulating film 240 provided on the activation layer 250, and a second gate electrode 230 extending in the first direction passing over the activation layer 250 via the gate insulating film 240. The activation layer 250 and the second gate electrode 230 are provided so as to be orthogonal to each other. A source or drain region is provided in the activation layer 250 on both sides of the intersection of the activation layer 250 and the second gate electrode 230.

The second gate electrode 230 functions as the word line WL by being provided so as to extend in the first direction. One of the source or drain regions provided in the activation layer 250 is electrically connected to the first gate electrode 130. On the other hand, the other of the source or drain regions provided in the activation layer 250 is electrically connected to a first wiring layer 310 (first bit line BL) extending in the second direction via a contact 261.

Hereinafter, each configuration of the semiconductor storage apparatus 10 will be described more specifically.

The semiconductor substrate 100 is a substrate including a semiconductor material and on which the first transistor 11 is formed. The semiconductor substrate 100 may be a silicon substrate or a silicon on insulator (SOI) substrate in which an insulating film, e.g., of $SiO_2$, is sandwiched in the silicon substrate. Alternatively, the semiconductor substrate 100 may be a substrate including another elemental semiconductor such as germanium, or a substrate including a compound semiconductor such as gallium arsenide (GaAs), gallium nitride (GaN), or silicon carbide (SiC).

An element isolation layer 105 includes an insulating material, and electrically insulates each of the semiconductor storage apparatuses 10 provided on the semiconductor substrate 100 from each other. The element isolation layer 105 is provided, for example, so as to extend in the first direction of the semiconductor substrate 100 (right and left direction when directly facing FIG. 2), and separates the surface of the semiconductor substrate 100 into parallel strip-shaped regions that are separated from each other.

The parallel strip-shaped regions separated from each other by the element isolation layer 105 become an activation region 150 in which the first transistor 11 is formed. The semiconductor substrate 100 of the activation region 150 may be doped with, for example, a first conductivity type impurity (for example, a p-type impurity such as boron (B) or aluminum (Al)).

The element isolation layer 105 may include an insulating oxynitride such as silicon oxide ($SiO_x$), silicon nitride ($SiN_x$), or silicon oxynitride (SiON). For example, the element isolation layer 105 may be formed such that a part of the semiconductor substrate 100 in a predetermined region is removed by etching or the like using a shallow trench isolation (STI) method and then an opening formed by the etching or the like is filled with silicon oxide ($SiO_x$). Furthermore, the element isolation layer 105 may be formed by thermally oxidizing the semiconductor substrate 100 in a predetermined region using a local oxidation of silicon (LOCOS) method.

The ferroelectric film 140 includes a ferroelectric material and is provided on the semiconductor substrate 100. Specifically, the ferroelectric film 140 is provided on the semiconductor substrate 100 for each memory cell so as to cross the activation region 150 in the second direction.

The ferroelectric film 140 includes a ferroelectric material which is spontaneously polarized and whose remanent polarization direction can be controlled by an external electric field. For example, the ferroelectric film 140 may include a perovskite structure ferroelectric material such as lead zirconate titanate ($Pb(Zr,Ti)O_3$: PZT) or strontium bismuth tantalate ($SrBi_2Ta_2O_9$: SBT). Furthermore, the ferroelectric film 140 may be a ferroelectric film obtained by modifying a film including a high dielectric material such as $HfO_x$, $ZrO_x$, or $HfZrO_x$ by heat treatment or the like, or may be a ferroelectric film modified by introducing atoms such as lanthanum (La), silicon (Si), or gadolinium (Gd) into a film including the aforementioned high dielectric material. Moreover, the ferroelectric film 140 may include a single layer or may include a plurality of layers. For example, the ferroelectric film 140 may be a single layer film including a ferroelectric material such as $HfO_x$. The ferroelectric film 140 can be formed by using atomic layer deposition (ALD), chemical vapor deposition (CVD), or the like.

The first gate electrode 130 includes a conductive material and is provided on the ferroelectric film 140. Specifically, the first gate electrode 130 is provided for each memory cell on the ferroelectric film 140 so as to cross the activation region 150 in the second direction.

For example, the first gate electrode 130 may include polysilicon or the like, and may include a metal, an alloy, a metal compound, or an alloy of a refractory metal (such as Ni) and polysilicon (so-called silicide). Furthermore, the first gate electrode 130 may include ruthenium (Ru), ruthenium oxide ($RuO_2$), or the like. Specifically, the first gate electrode 130 may be formed in a stack structure of a metal layer and a polysilicon layer. For example, the first gate electrode 130 may be formed in a stack structure of a metal layer including TiN or TaN provided on the ferroelectric film 140 and a polysilicon layer. With such a stack structure, the first gate electrode 130 can reduce the wiring resistance as compared with the case where it includes only the polysilicon layer.

The source or drain regions 151 are a second conductivity type region formed in the semiconductor substrate 100. The source or drain regions 151 are provided in the activation region 150 on both sides of the first gate electrode 130. One of the source or drain regions 151 is electrically connected to the second wiring layer 410 (source line Vs) extending in the second direction via the contact 271. Furthermore, the other of the source or drain regions 151 is electrically connected to the third wiring layer 512 (second bit line BL−) extending in the first direction via the contact 272 and the second wiring layer 420.

For example, the source or drain regions 151 may be formed by introducing a second conductivity type impurity (for example, an n-type impurity such as phosphorus (P) or arsenic (As)) into a predetermined region of the activation region 150. Furthermore, between the source or drain region 151 and the first gate electrode 130, a lightly-doped drain (LDD) region having the same conductivity type as the source or drain region 151 and having a lower concentration than the source or drain region 151 may be formed.

Note that any of the source or drain regions 151 provided on both sides of the first gate electrode 130 may function as a source region or any of them may function as a drain region. These can be arbitrarily changed depending on the polarity of the conductivity type impurity or the wiring to be connected.

A sidewall insulating film 132 includes an insulating material, and is provided as a sidewall on the side surface of the first gate electrode 130 and the activation layer 250, which will be described later. Specifically, the sidewall insulating film 132 can be formed by stacking the first gate electrode 130 and the activation layer 250, forming an insulating film uniformly, and performing vertical anisotropic etching on the insulating film. For example, the sidewall insulating film 132 may include an insulating oxynitride such as silicon oxide ($SiO_x$), silicon nitride ($SiN_x$), or silicon oxynitride (SiON) in a single layer or a plurality of layers.

The sidewall insulating film 132 shields the conductive impurities introduced into the activation region 150, so that the positional relationship between the first gate electrode 130 and the source or drain region 151 into which the conductivity type impurity is introduced is caused to be self-aligned. In a case where the sidewall insulating film 132 includes a plurality of layers, the impurity can be introduced into the activation region 150 step by step, so that the LDD region can be self-alignedly formed between the source or drain region 151 and the first gate electrode 130.

The activation layer 250 is provided on the first gate electrode 130 and is provided over the plurality of activation regions 150 by being extended in the second direction. Specifically, the activation layer 250 alternately passes over the first gate electrode 130 and the semiconductor substrate 100 along the outer shape of the first gate electrode 130 and the semiconductor substrate 100 so as to extend up and down and is provided by being extended in the second direction.

The activation layer 250 is a layer in which the channel of the second transistor and the source or drain region are formed, and includes a semiconductor material. For example, the activation layer 250 may include polycrystalline, single-crystal, or amorphous silicon (Si), may include a compound semiconductor such as germanium (Ge), gallium arsenide (GaAs), or indium gallium arsenide (InGaAs), may include an oxide semiconductor such as zinc oxide (ZnO) or gallium indium tin oxide (InGaZnO), or may include a two-dimensional semiconductor such as molybdenum sulfide ($MoS_2$).

By introducing a second conductivity type impurity (for example, n-type impurity such as phosphorus (P) and arsenic (As)) into the activation layer 250 on both sides of the intersection with the second gate electrode 230, the source or drain region of the second transistor 12 is formed. For example, the channel of the second transistor 12 may be formed in the activation layer 250 in the A-A cross-section of FIG. 2. Furthermore, the source or drain region of the second transistor 12 may be formed by introducing the second conductivity type impurity into the activation layer 250 in the B-B cross-section of FIG. 2.

One of the source or drain regions formed in the activation layer 250 is formed on the first gate electrode 130 and is electrically connected to the first gate electrode 130. Furthermore, the other of the source or drain regions provided in the activation layer 250 is electrically connected to a first wiring layer 310 (first bit line BL) extending in the second direction via the contact 261.

The gate insulating film 240 includes an insulating material and is provided on the semiconductor substrate 100 and the activation layer 250. Specifically, the gate insulating film 240 is uniformly provided on the first transistor 11 and the activation layer 250. The gate insulating film 240 may include an insulating material known as a gate insulating film of a field effect transistor. For example, the gate insulating film 240 may include an insulating oxynitride such as silicon oxide ($SiO_x$), silicon nitride ($SiN_x$), or silicon oxynitride (SiON).

The second gate electrode 230 includes a conductive material and is provided on the gate insulating film 240 by extending in the first direction. Specifically, the second gate electrode 230 is provided on the element isolation layer 105 of the semiconductor substrate 100 so as to extend in the first direction via the gate insulating film 240. Furthermore, the second gate electrode 230 is provided on the activation layer 250 via the gate insulating film 240 across the orthogonal activation layer 250. The second gate electrode 230 functions as the word line WL by being provided so as to extend in the first direction.

The second gate electrode 230 may include polysilicon or the like, and may include a metal, an alloy, a metal compound, or an alloy of a refractory metal (such as Ni) and polysilicon (so-called silicide). Furthermore, the second gate electrode 230 may include ruthenium (Ru), ruthenium oxide ($RuO_2$), or the like. Specifically, the second gate electrode 230 may be formed in a stack structure of a metal layer and a polysilicon layer. For example, the second gate electrode 230 may be formed in a stack structure of a metal layer including TiN or TaN provided on the gate insulating film 240 and a polysilicon layer. With such a stack structure, the second gate electrode 230 can reduce the wiring resistance as compared with the case where it includes only the polysilicon layer.

The second gate electrode 230 is provided so as to be orthogonal to the activation layer 250 via the gate insulating film 240 and forms the channel of the second transistor 12 in the activation layer 250 overlapping with the second gate electrode 230 in a plan view. The channel formed in the activation layer 250 reduces the resistance between the source region and the drain region formed in the activation layer 250, thereby bringing conduction between the first gate electrode 130 and the contact 261 and the first wiring layer 310.

A planarized film 200 includes an insulating material, accommodates the first transistor 11 and the second transistor 12, and is provided over the entire surface of the semiconductor storage apparatus 10. For example, the planarized film 200 may include an insulating oxynitride such as silicon oxide ($SiO_x$), silicon nitride ($SiN_x$), or silicon oxynitride (SiON).

The contact 261 includes a conductive material and is provided to extend through the planarized film 200 and the gate insulating film 240. Specifically, the contact 261 is provided to extend through the planarized film 200 and the gate insulating film 240 on the source or drain region of the second transistor 12 provided in the activation layer 250 on the side facing the first gate electrode 130 across the second gate electrode 230 extending in the first direction. Therefore, the contact 261 electrically connects the other of the source and the drain of the second transistor to the first wiring layer 310 (first bit line BL).

For example, the contact 261 may include a low resistance metal such as titanium (Ti) or tungsten (W), or a metal compound such as titanium nitride (TiN) or tantalum nitride (TaN). The contact 261 may include a single layer or may include a stack body of a plurality of layers. For example, the contact 261 may include a stack body including Ti or TiN and W.

A lower first interlayer film 301 accommodates the first wiring layer 310 and is provided on the planarized film 200 over the entire surface of the semiconductor storage apparatus 10. For example, the lower first interlayer film 301 may include an insulating oxynitride such as silicon oxide ($SiO_x$), silicon nitride ($SiN_x$), or silicon oxynitride (SiON).

The first wiring layer 310 includes a conductive material and is provided on the planarized film 200. Specifically, the first wiring layer 310 is provided on the contact 261 as wiring extending in the second direction. The first wiring layer 310 functions as the first bit line BL by being electrically connected to the other of the source and the drain of the second transistor 12 via the contact 261. The first wiring layer 310 may include a metal material such as copper (Cu) or aluminum (Al), or may include a Cu damascene structure or a dual damascene structure, for example.

An upper first interlayer film 302 is provided on the lower first interlayer film 301 over the entire surface of the semiconductor storage apparatus 10. The upper first interlayer film 302 is provided to electrically insulate the first wiring layer 310 from the second wiring layers 410 and 420. For example, the upper first interlayer film 302 may include an insulating oxynitride such as silicon oxide ($SiO_x$), silicon nitride ($SiN_x$), or silicon oxynitride (SiON).

The contacts 271 and 272 include a conductive material and are provided so as to extend through the planarized film 200, the lower first interlayer film 301, and the upper first interlayer film 302. Specifically, the contact 271 is provided on one of the source or drain regions 151 and electrically connects one of the source and the drain of the first transistor 11 to the second wiring layer 410 (source line Vs). The contact 272 is provided on the other of the source or drain regions 151, and electrically connects the other of the source and the drain of the first transistor 11 to the third wiring layer 512 (second bit line BL−) via the second wiring layer 420 and a via 511.

For example, the contacts 271 and 272 may include a low resistance metal such as titanium (Ti) or tungsten (W), or a metal compound such as titanium nitride (TiN) or tantalum nitride (TaN). The contacts 271 and 272 may include a single layer or may include a stack body of a plurality of layers. For example, the contacts 271 and 272 may include a stack body including Ti or TiN and W.

A second interlayer film 400 accommodates the second wiring layers 410 and 420 and is provided on the upper first interlayer film 302 over the entire surface of the semiconductor storage apparatus 10. For example, the second interlayer film 400 may include an insulating oxynitride such as silicon oxide ($SiO_x$), silicon nitride ($SiN_x$), or silicon oxynitride (SiON).

The second wiring layers 410 and 420 include a conductive material and are provided on the upper first interlayer film 302. Specifically, the second wiring layer 410 is provided on the contact 271 as wiring extending in the second direction. The second wiring layer 410 functions as the source line Vs by being electrically connected to one of the source and the drain of the first transistor 11 via the contact 271. The second wiring layer 420 is provided on the contact 272 as a wiring layer that electrically connects the contact 272 in a lower layer and the via 511 in an upper layer. For example, the second wiring layers 410 and 420 may include a metal material such as copper (Cu) or aluminum (Al), or may include a Cu damascene structure or a dual damascene structure.

The via 511 includes a conductive material and is provided to extend through a lower third interlayer film 501. Specifically, the via 511 is provided on the second wiring layer 420 as a via that electrically connects the second wiring layer 420 in a lower layer and the third wiring layer 512 in an upper layer. For example, the via 511 may include a low resistance metal such as titanium (Ti) or tungsten (W), or a metal compound such as titanium nitride (TiN) or tantalum nitride (TaN). The via 511 may include a single layer or may include a stack body of a plurality of layers, and may include a stack body including Ti or TiN and W, for example.

The lower third interlayer film 501 accommodates the via 511 and is provided on the second interlayer film 400 over the entire surface of the semiconductor storage apparatus 10. For example, the lower third interlayer film 501 may include an insulating oxynitride such as silicon oxide ($SiO_x$), silicon nitride ($SiN_x$), or silicon oxynitride (SiON).

The third wiring layer 512 includes a conductive material and is provided on the via 511 as wiring extending in the first direction. The third wiring layer 512 functions as the second bit line BL– by being electrically connected to the other of the source and the drain of the first transistor 11 via the via 511, the second wiring layer 420, and the contact 272. For example, the third wiring layer 512 may include a metal material such as copper (Cu) or aluminum (Al), or may include a Cu damascene structure or a dual damascene structure.

With the structure described above, in the semiconductor storage apparatus 10, the second transistor 12 can be formed as a thin film transistor (TFT) on the first transistor 11. With this structure, the semiconductor storage apparatus 10 can further reduce the plane area formed.

Therefore, the semiconductor storage apparatus 10 according to the present embodiment enables control of the presence or absence of the generation of an electric field in the ferroelectric film 140 of the first transistor 11 by the second transistor 12 and enables formation with a reduced plane area. With this structure, since the semiconductor storage apparatus 10 can improve the degree of integration of the memory cells of the storage apparatus 1, it is possible to improve the storage density of the storage apparatus 1.

3. MANUFACTURING METHOD

Subsequently, a method for manufacturing the semiconductor storage apparatus 10 according to the present embodiment will be described with reference to FIGS. 3 to 13. FIGS. 3 to 13 are plan views and cross-sectional views explaining a process of a method for manufacturing the semiconductor storage apparatus 10.

Note that, in FIGS. 3 to 13, the illustration of the layers formed over the entire surface of the semiconductor storage apparatus 10 is omitted similarly to FIG. 2. Furthermore, each of the cross-sectional views shows a cross-section obtained by cutting the plan view along the line AA, the line BB, and the line CC.

Figure 3:
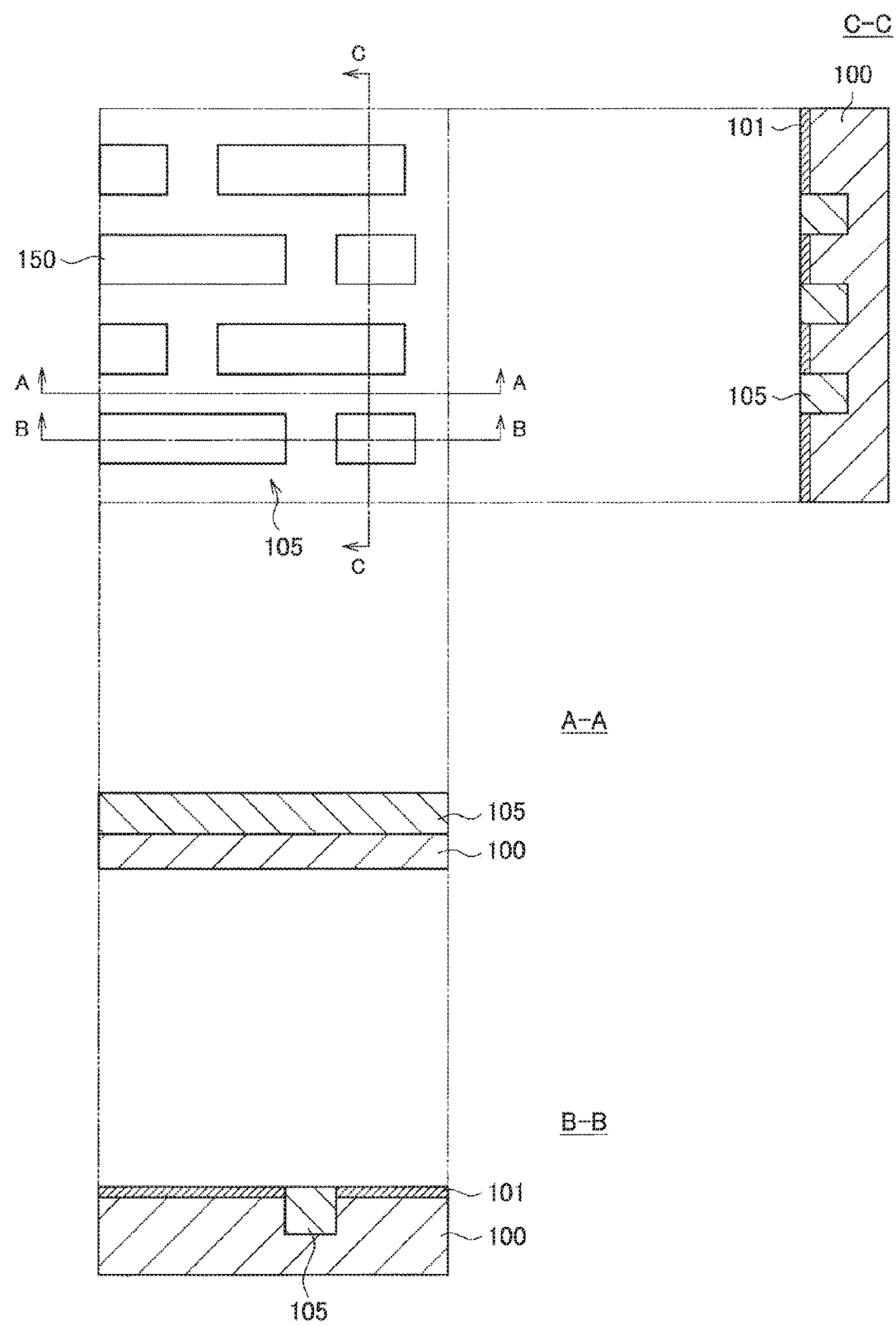
FIG. 3 is a plan view and a cross-sectional view explaining a process of a method for manufacturing the semiconductor storage apparatus according to the embodiment.

First, as shown in FIG. 3, the element isolation layer 105 is formed on the semiconductor substrate 100, and the activation region 150 in which the first transistor 11 is formed is formed.

Specifically, a $SiO_2$ film is formed on the semiconductor substrate 100 including Si by dry oxidation or the like, and a $Si_3N_4$ film is further formed by low pressure chemical vapor deposition (CVD) or the like. Subsequently, a resist layer patterned so as to protect the activation region 150 is formed on the $Si_3N_4$ film, and the $SiO_2$ film, the $Si_3N_4$ film, and the semiconductor substrate 100 are etched to a depth of 350 nm to 400 nm. Next, the element isolation layer 105 is formed by forming $SiO_2$ with a film thickness of 650 nm to 700 nm and filling the opening by etching. For forming the $SiO_2$ film, for example, high density plasma CVD which has favorable step coverage and is capable of forming a dense $SiO_2$ film may be used.

Then, the surface of the semiconductor substrate 100 is planarized by removing the excessively formed $SiO_2$ film using chemical mechanical polish (CMP) or the like. It is sufficient if the removal of the $SiO_2$ film by CMP may be performed, for example, until the $Si_3N_4$ film is exposed.

Moreover, the $Si_3N_4$ film is removed using hot phosphoric acid or the like. Note that, in order to make the $SiO_2$ film of the element isolation layer 105 a denser film or to round the corners of the activation region 150, the semiconductor substrate 100 can also be annealed under $N_2$, $O_2$, or $H_2/O_2$ environment before the removal of the $Si_3N_4$ film. Next, the surface of the semiconductor substrate 100 of the activation region 150 is oxidized by about 10 nm to form an oxide film 101, and then a first conductivity type impurity (for example, boron (B) or the like) is ion-implanted to turn the activation region 150 to a first conductivity type well region.

Figure 4:
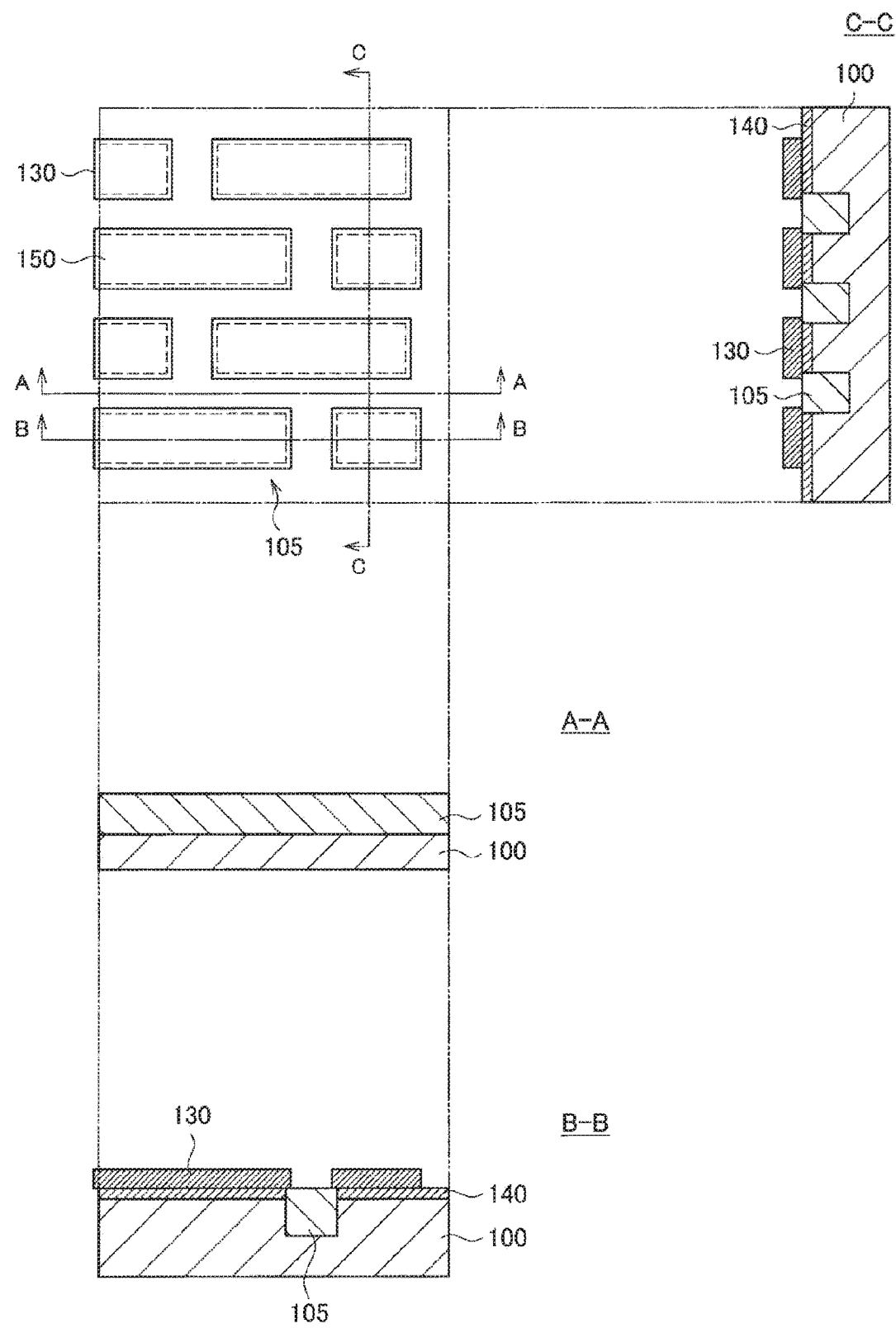
FIG. 4 is a plan view and a cross-sectional view explaining a process of a method for manufacturing the semiconductor storage apparatus according to the embodiment.

Next, as shown in FIG. 4, after forming the ferroelectric film 140, the first gate electrode 130 is formed on the ferroelectric film 140.

Specifically, first, the oxide film 101 covering the surface of the semiconductor substrate 100 is peeled off using a hydrofluoric acid solution or the like. Note that the oxide film 101 may be a thermal oxide film ($SiO_2$), a thermal oxynitride film (SiON), or a plasma-nitrided oxynitride film (SiON). Thereafter, using CVD or ALD, hafnium oxide ($HfO_x$) is formed to a film thickness of 3 nm to 10 nm on the semiconductor substrate 100. Note that hafnium oxide ($HfO_x$), which is a high dielectric material, is converted into the ferroelectric film 140 by being subjected to annealing treatment in the subsequent stage.

Note that, instead of hafnium oxide, a high dielectric material such as zirconium oxide ($ZrO_x$) or hafnium zirconium oxide ($HfZrO_x$) can be used. Furthermore, it is also possible to dope these high dielectric materials with lanthanum (La), silicon (Si), gadolinium (Gd), or the like to convert them into ferroelectric materials. Furthermore, as the ferroelectric film 140, it is possible to use a perovskite-based ferroelectric material such as lead zirconate titanate (PZT) or strontium bismuth tantalate (SBT).

Next, using CVD or ALD, TiN is formed to a film thickness of 5 nm to 20 nm as an electrode material on hafnium oxide ($HfO_x$). Note that TaN, Ru, $RuO_2$, or the like may be used as the electrode material. Thereafter, using a patterned resist as a mask, anisotropic etching is performed to pattern the formed hafnium oxide ($HfO_x$) and TiN, so that hafnium oxide ($HfO_x$) and TiN are deposited on the region covering the activation region 150.

Figure 5:
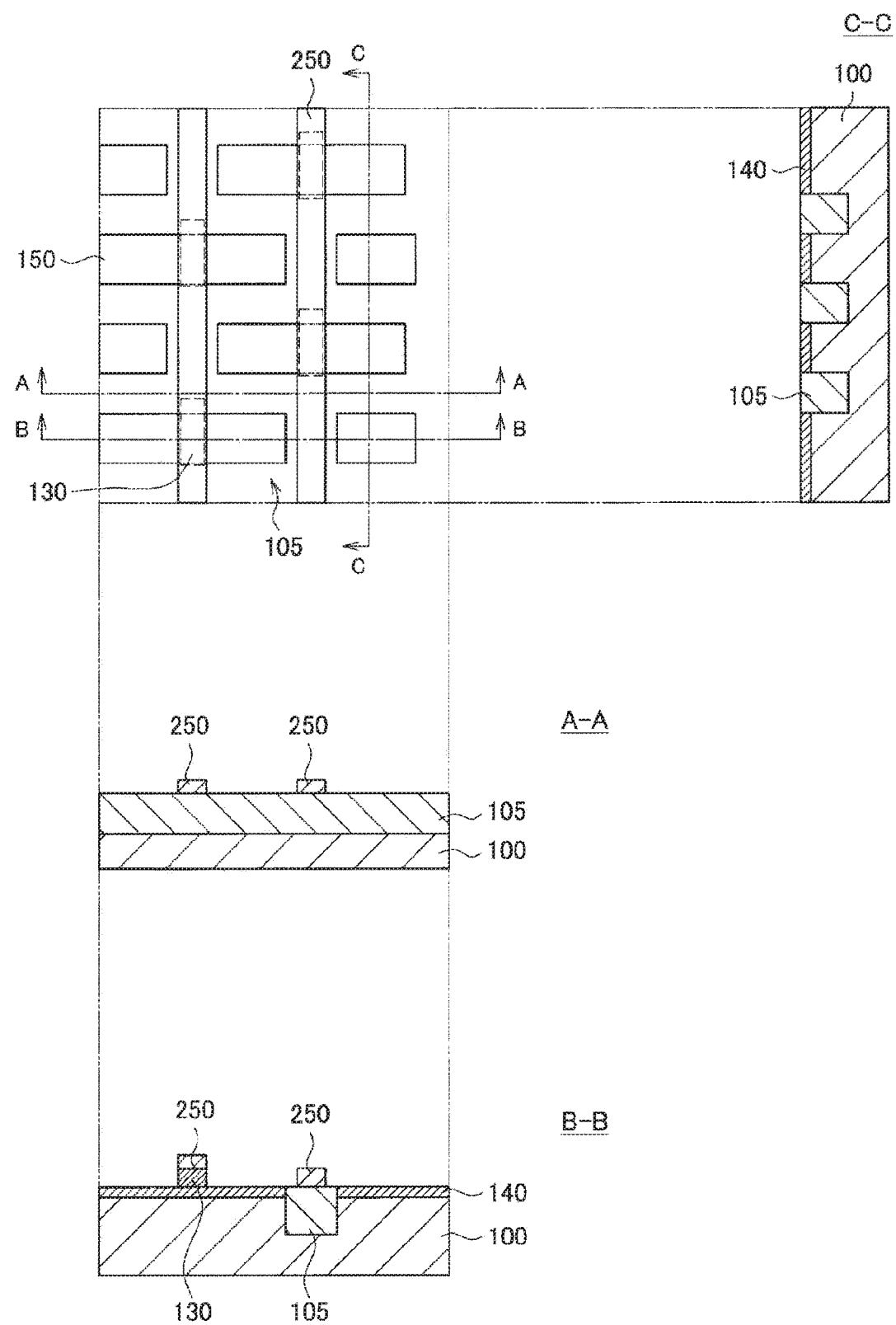
FIG. 5 is a plan view and a cross-sectional view explaining a process of a method for manufacturing the semiconductor storage apparatus according to the embodiment.

Subsequently, as shown in FIG. 5, after forming the activation layer 250, the activation layer 250 and the first gate electrode 130 are simultaneously patterned.

Specifically, a polysilicon film is formed to a film thickness of 50 nm to 150 nm by using low pressure CVD with $SiH_4$ gas as a source gas at a film forming temperature of 580° C. to 620° C. Thereafter, by using a patterned resist as a mask, anisotropic etching is performed on the formed polysilicon to form the activation layer 250. For anisotropic etching, for example, HBr or Cl-based gas can be used. At this time, the first gate electrode 130 is formed by simultaneously performing anisotropic etching on TiN, which is an under layer of the polysilicon.

Figure 6:
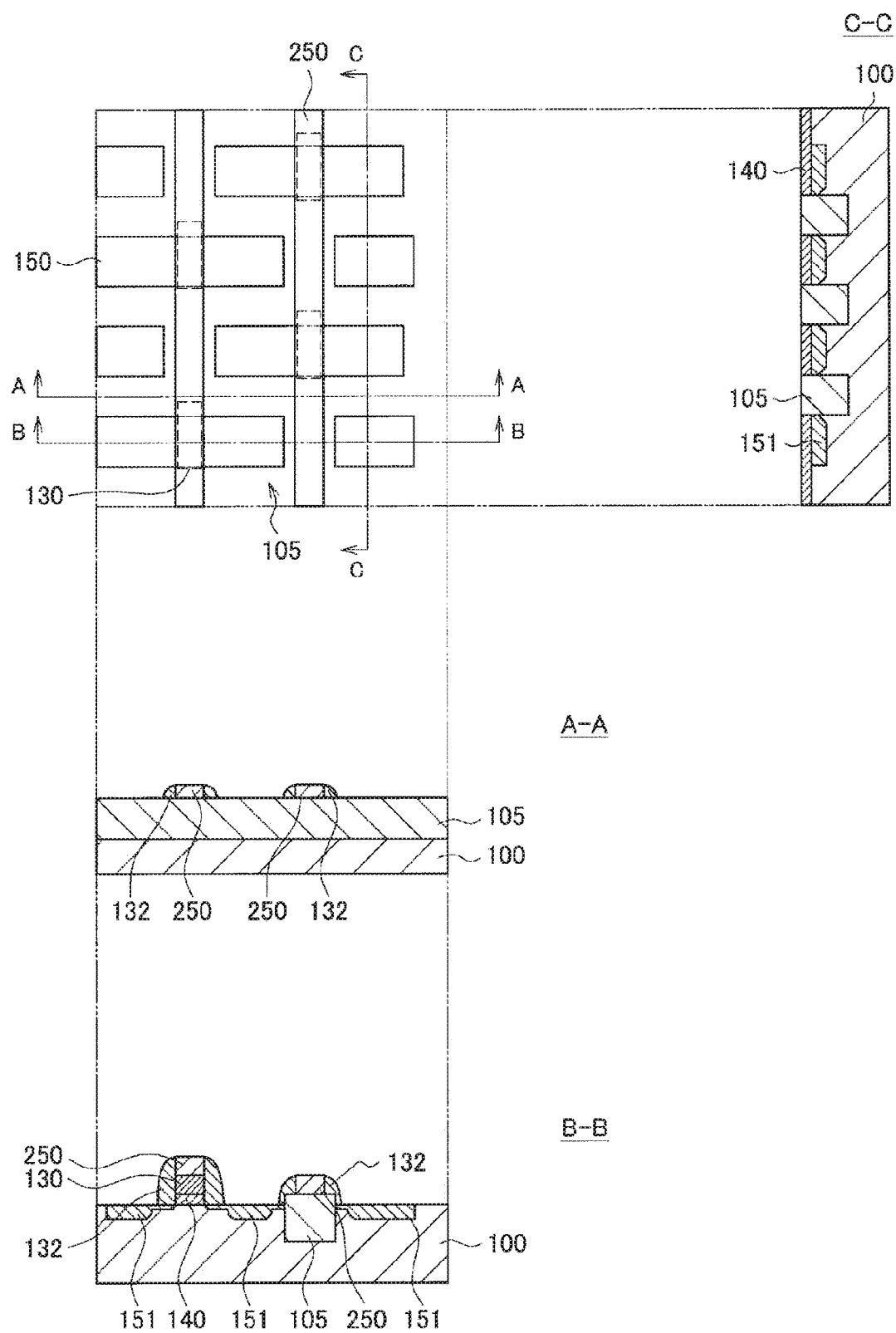
FIG. 6 is a plan view and a cross-sectional view explaining a process of a method for manufacturing the semiconductor storage apparatus according to the embodiment.

Next, as shown in FIG. 6, the sidewall insulating film 132 is formed on both side surfaces of the first gate electrode 130 and the activation layer 250, and the source or drain region 151 is formed in the semiconductor substrate 100.

Specifically, arsenic (As) that is the second conductivity type impurity is ion-implanted on both sides of the first gate electrode 130 and the activation layer 250 at a concentration of 5 to $20\times10^{13}/cm^2$ at 5 keV to 20 keV to form the LDD region. Since the LDD region suppresses a short channel effect, it is possible to suppress the characteristic variation of the first transistor 11. Note that phosphorus (P) can be used as the second conductivity type impurity.

Next, after forming $SiO_2$ with a film thickness of 10 nm to 30 nm by plasma CVD, $Si_3N_4$ is formed with a film thickness of 30 nm to 50 nm by plasma CVD to form an insulating film for sidewalls. Thereafter, anisotropic etching is performed on the insulating film for sidewalls to form the sidewall insulating film 132 on both side surfaces of the first gate electrode 130 and the activation layer 250.

Thereafter, using a resist patterned by lithography so as to cover the channel region of the activation layer 250 as a mask, arsenic (As) which is a second conductivity type impurity is ion-implanted into the activation layer 250 at 20 keV to 50 ke at a concentration of 1 to $2\times10^{15}/cm^2$. Therefore, the second conductivity type impurity is introduced into the semiconductor substrate 100 on both sides of the first gate electrode 130 to form the source or drain region 151. Moreover, rapid thermal annealing (RTA) is performed at 1000° C. for 5 seconds to activate the ion-implanted second conductivity type impurity. Therefore, the first transistor 11 is formed.

Note that it is also possible to activate the impurity by spike RTA in order to promote the activation of the introduced impurity and suppress the diffusion of the impurity. Furthermore, the annealing for activating the second conductivity type impurity described above may also serve as an annealing treatment for converting hafnium oxide ($HfO_x$), which is a high dielectric material, into a ferroelectric material. In such a case, the annealing conditions may be adjusted appropriately.

Moreover, although not shown in FIG. 6 and the like, a silicide compound such as $CoSi_2$ or NiSi may be formed on the surface of the source or drain region 151 in order to reduce the contact resistance.

Figure 7:
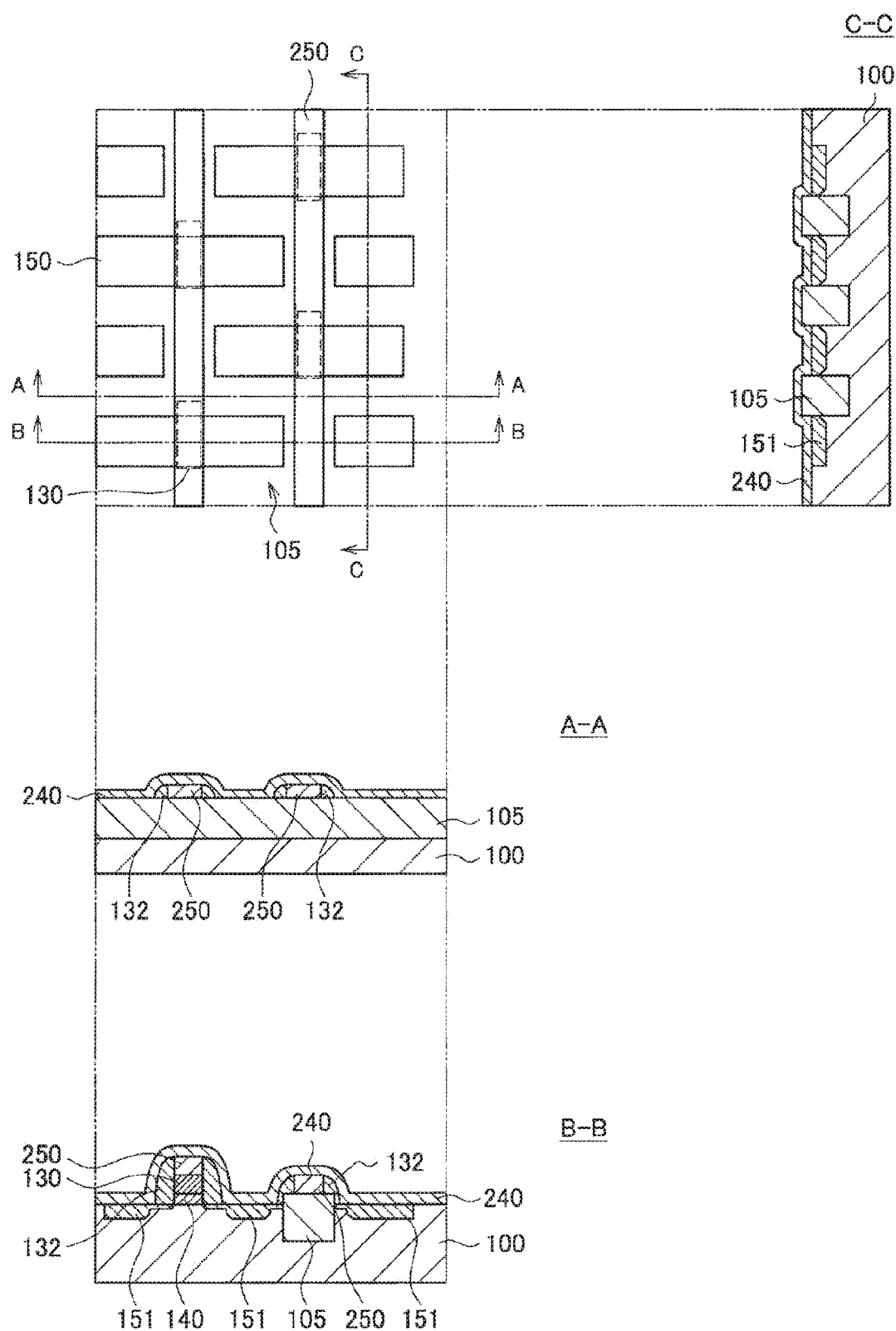
FIG. 7 is a plan view and a cross-sectional view explaining a process of a method for manufacturing the semiconductor storage apparatus according to the embodiment.

Subsequently, as shown in FIG. 7, after the source or drain region is formed by introducing the second conductivity type impurity into the activation layer 250, and the gate insulating film 240 is formed on the activation layer 250.

Specifically, using a resist patterned by lithography so as to cover the channel region of the activation layer 250 as a mask, arsenic (As) which is a second conductivity type impurity is ion-implanted into the activation layer 250 of a predetermined region at 10 keV to 50 keV at a concentration of 1 to $2\times10^{15}/cm^2$ to introduce the second conductivity type impurity to the activation layer 250 of the predetermined region. Therefore, the source or drain region can be formed in the activation layer 250. The predetermined region of the activation layer 250 into which the second conductivity type impurity is introduced is, for example, a region on both sides of a region where the second gate electrode 230 is formed in the subsequent stage. Thereafter, the gate insulating film 240 is formed on the activation layer 250 by forming $SiO_2$ or SiN to a film thickness of 5 nm to 10 nm over the entire surface of the semiconductor storage apparatus 10 by CVD.

Figure 8:
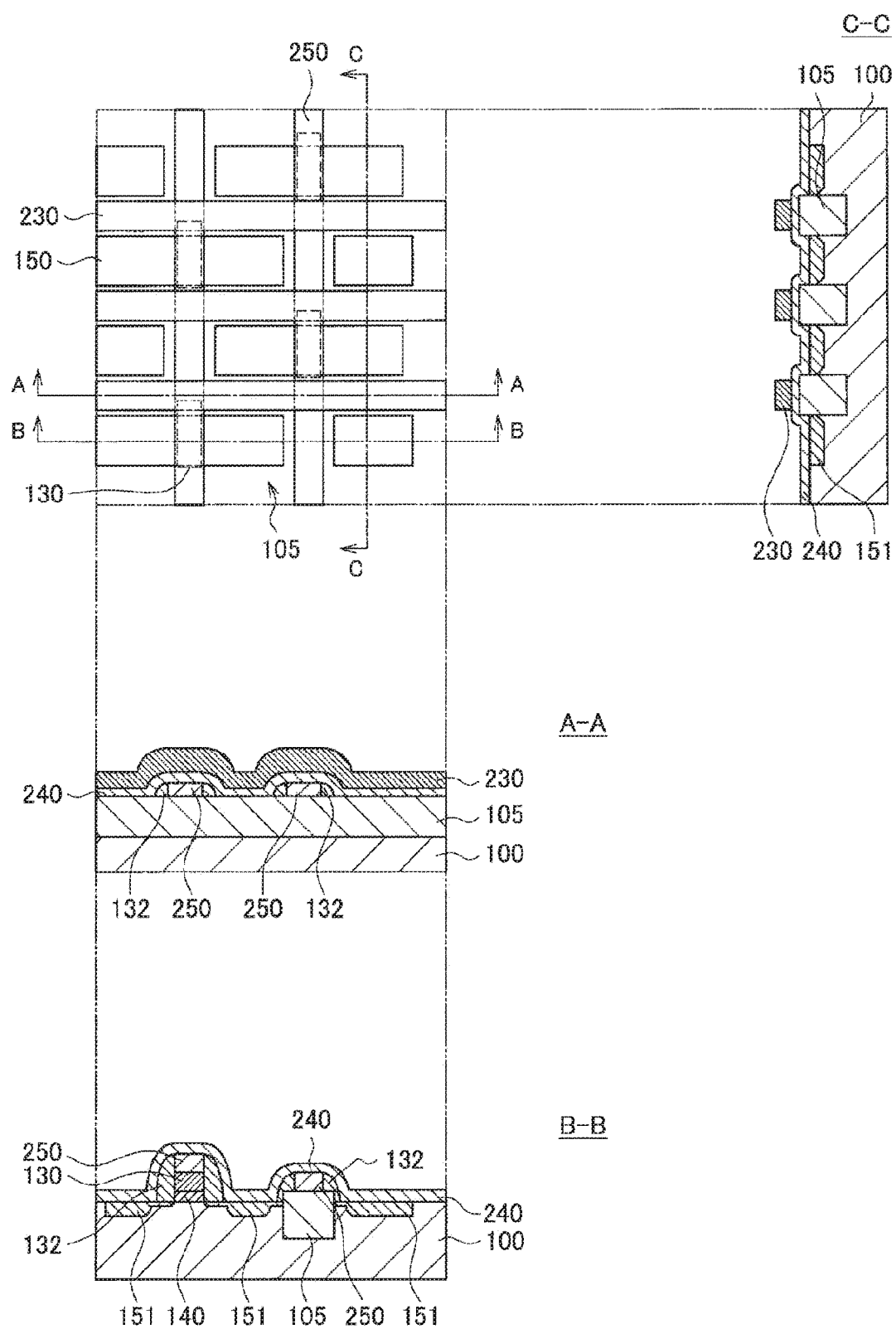
FIG. 8 is a plan view and a cross-sectional view explaining a process of a method for manufacturing the semiconductor storage apparatus according to the embodiment.

Next, as shown in FIG. 8, the second gate electrode 230 extending in the first direction is formed on the gate insulating film 240 so as to be orthogonal to the activation layer 250 extending in the second direction.

Specifically, a polysilicon film is formed to a film thickness of 20 nm to 150 nm on the gate insulating film 240 by using low pressure CVD with $SiH_4$ gas as a source gas at a film forming temperature of 580° C. to 620° C. Thereafter, by using a patterned resist as a mask, anisotropic etching is performed on the formed polysilicon to form the second gate electrode 230. For anisotropic etching, for example, HBr or Cl-based gas can be used. Note that W, $WSi_x$, or the like may be further stacked on the second gate electrode 230 in order to reduce the resistance, and the second gate electrode 230 may be salicided. Therefore, the second transistor 12 is formed.

Figure 9:
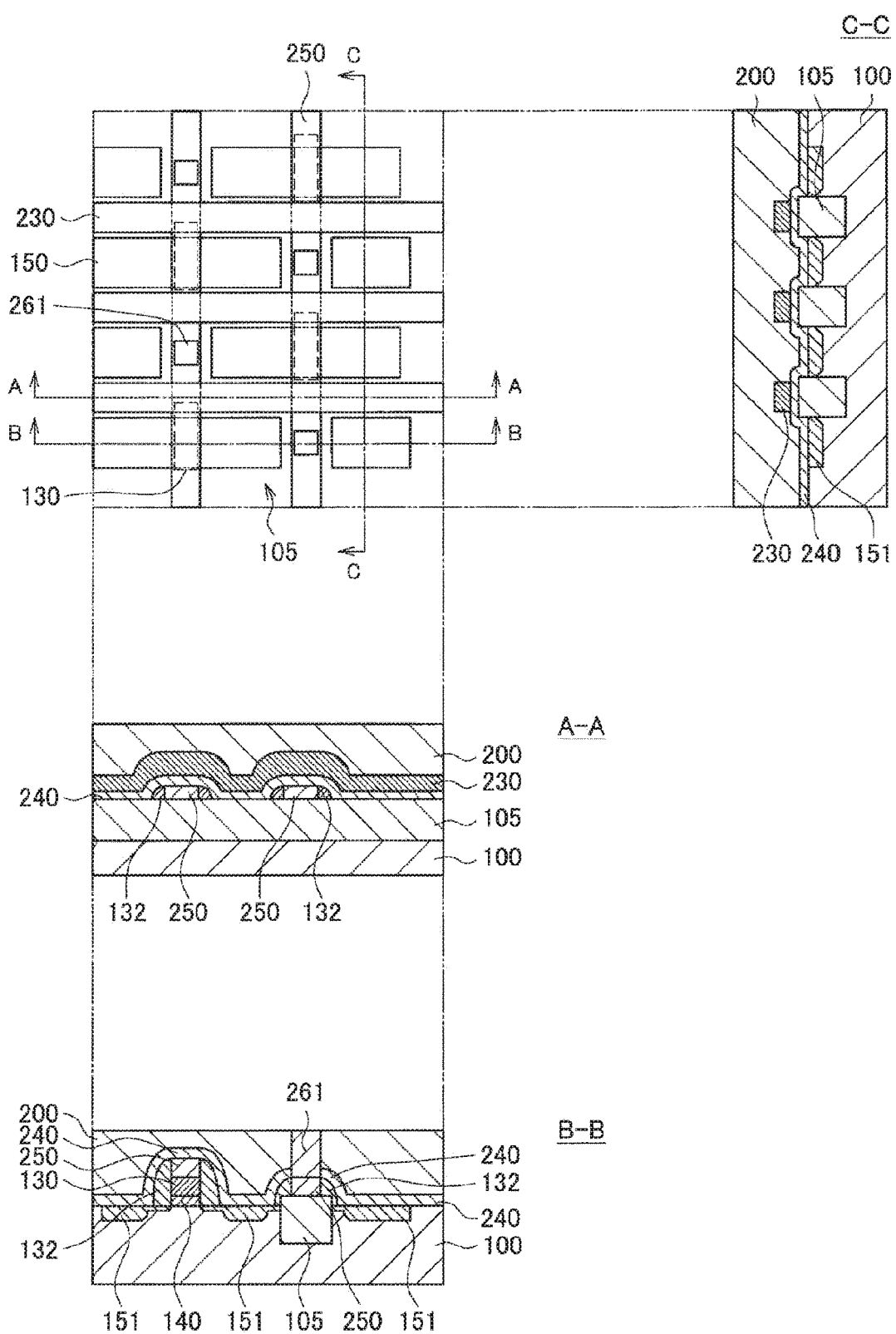
FIG. 9 is a plan view and a cross-sectional view explaining a process of a method for manufacturing the semiconductor storage apparatus according to the embodiment.

Subsequently, as shown in FIG. 9, after the planarized film 200 is formed over the entire surface of the semiconductor storage apparatus 10, the contact 261 is formed.

Specifically, $SiO_2$ is formed over the entire surface of the semiconductor storage apparatus 10 by CVD or the like to a film thickness of 50 nm to 200 nm so as to accommodate the first transistor 11 and the second transistor 12. Thereafter, the formed $SiO_2$ layer is planarized by the CMP method to form the planarized film 200.

Next, etching is performed to form an opening in the planarized film 200. Specifically, the opening for exposing the activation layer 250 on the side facing the first gate electrode 130 across the second gate electrode 230 is formed in the planarized film 200 by etching. Then, Ti and TiN are formed with respect to the opening of the planarized film 200 by CVD or the like, W is further formed, and then planarized by the CMP method, so that the contact 261 is formed on the activation layer 250. Note that Ti and TiN may be formed by a sputtering method using ion metal plasma (IMP), for example. Furthermore, planarization may be performed using entire surface etching back instead of the CMP method.

Figure 10:
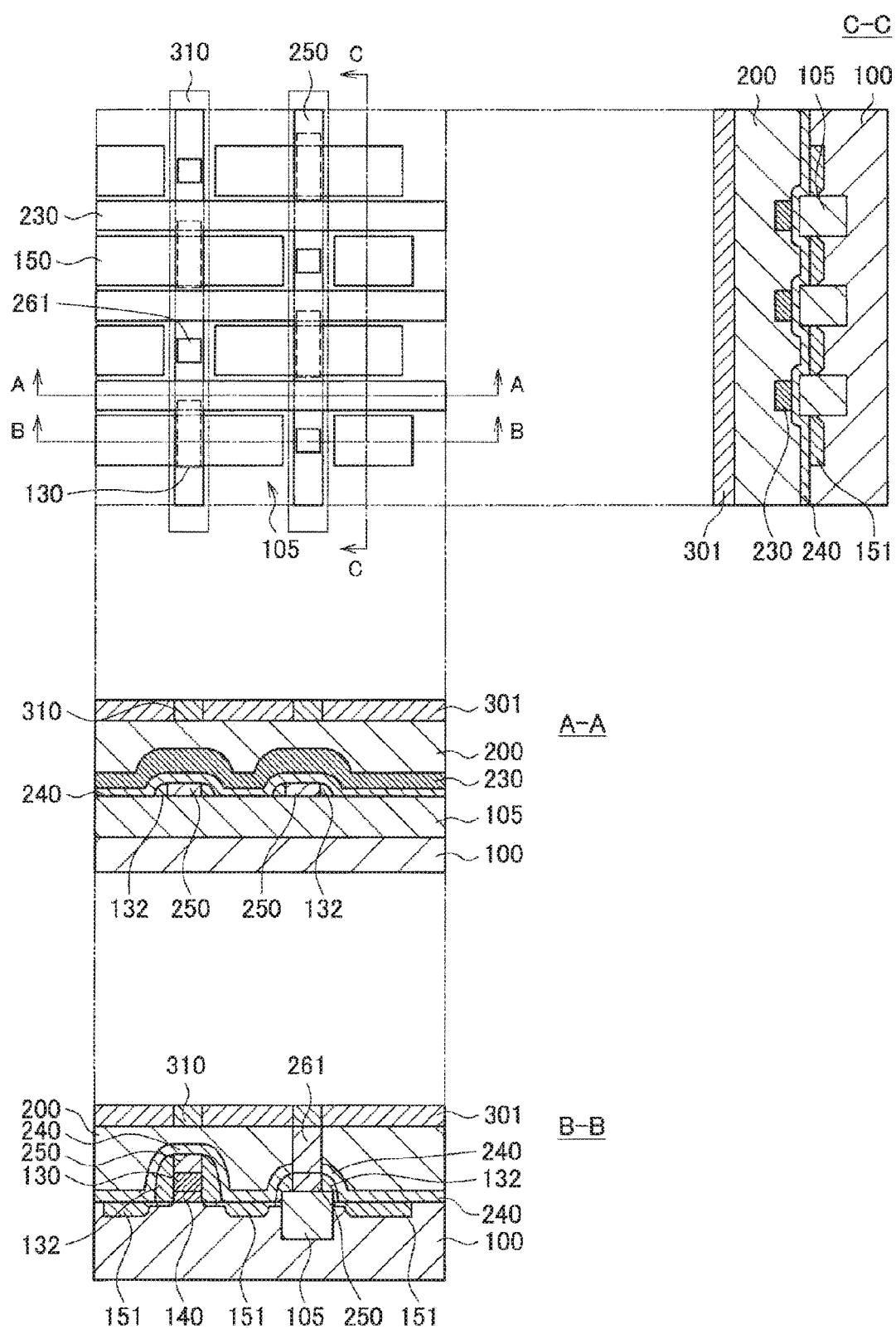
FIG. 10 is a plan view and a cross-sectional view explaining a process of a method for manufacturing the semiconductor storage apparatus according to the embodiment.

Next, as shown in FIG. 10, after forming the lower first interlayer film 301 on the planarized film 200, the first wiring layer 310 is formed.

Specifically, using CVD or the like, $SiO_2$ is formed over the entire surface of the semiconductor storage apparatus 10 on the planarized film 200 to a film thickness of 50 nm to 200 nm, and then planarized by the CMP method, so that the lower first interlayer film 301 is formed. Then, after forming an opening for forming an electrical connection with the contact 261 in the lower first interlayer film 301 by etching, Cu or the like is used as a wiring material to form the first wiring layer 310 by using a damascene structure or a dual damascene structure. Note that the first wiring layer 310 may include Al or the like. The first wiring layer 310 functions as the first bit line BL by being provided on the contact 261 so as to extend in the second direction.

Figure 11:
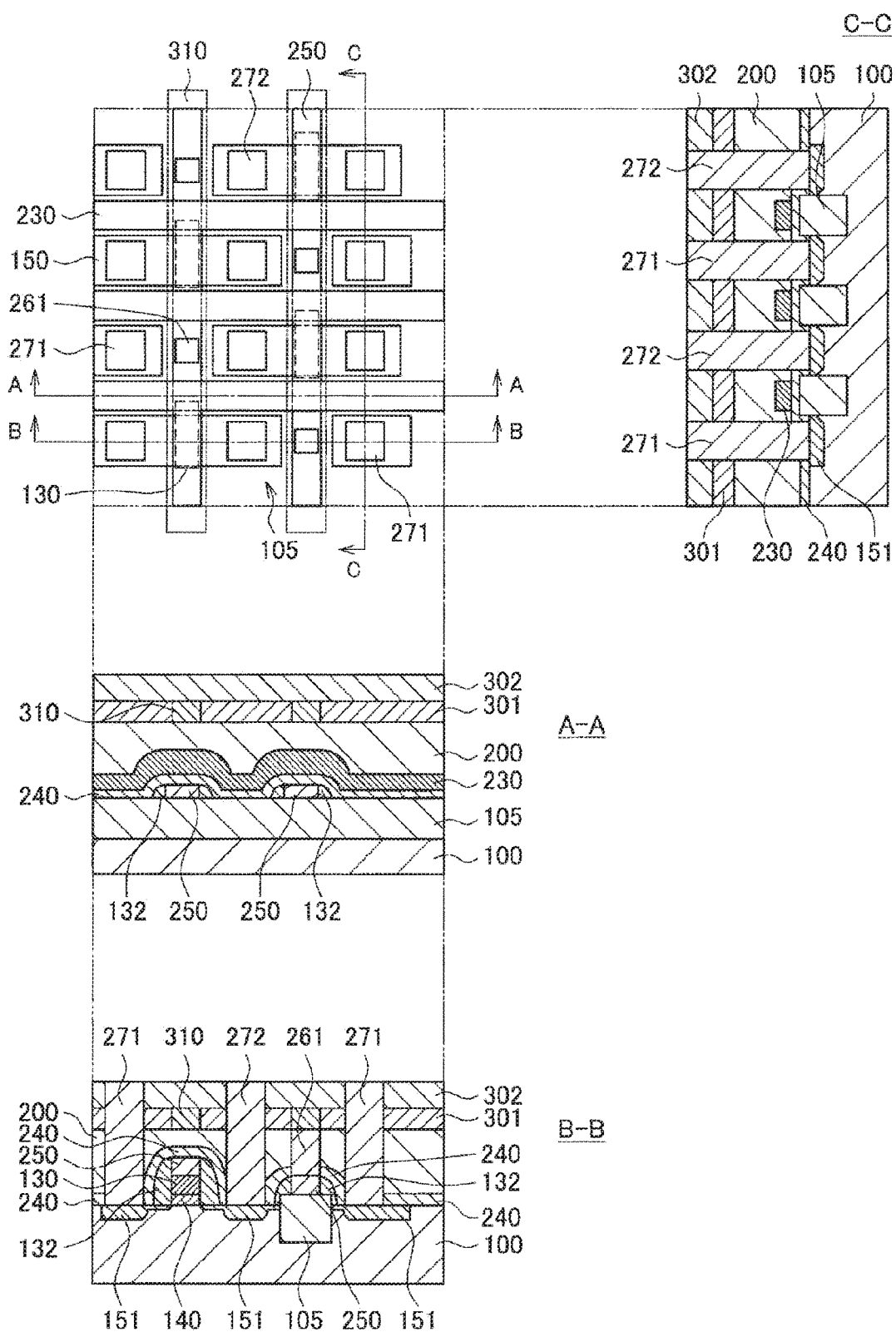
FIG. 11 is a plan view and a cross-sectional view explaining a process of a method for manufacturing the semiconductor storage apparatus according to the embodiment.

Subsequently, as shown in FIG. 11, after forming the upper first interlayer film 302 on the lower first interlayer film 301, the contacts 271 and 272 are formed.

Specifically, using CVD or the like, $SiO_2$ is formed over the entire surface of the semiconductor storage apparatus 10 on the lower first interlayer film 301 to a film thickness of 100 nm to 500 nm, and then planarized by the CMP method, so that the upper first interlayer film 302 is formed.

Thereafter, an opening for exposing the source or drain region 151 is formed in the upper first interlayer film 302, the lower first interlayer film 301, and the planarized film 200 by etching. Then, Ti and TiN are formed with respect to the formed opening by CVD or the like, W is further formed, and then planarized by the CMP method, so that the contacts 271 and 272 are formed on the source or drain region 151. Note that Ti and TiN may be formed by a sputtering method using ion metal plasma (IMP), for example. Furthermore, planarization may be performed using entire surface etching back instead of the CMP method.

Figure 12:
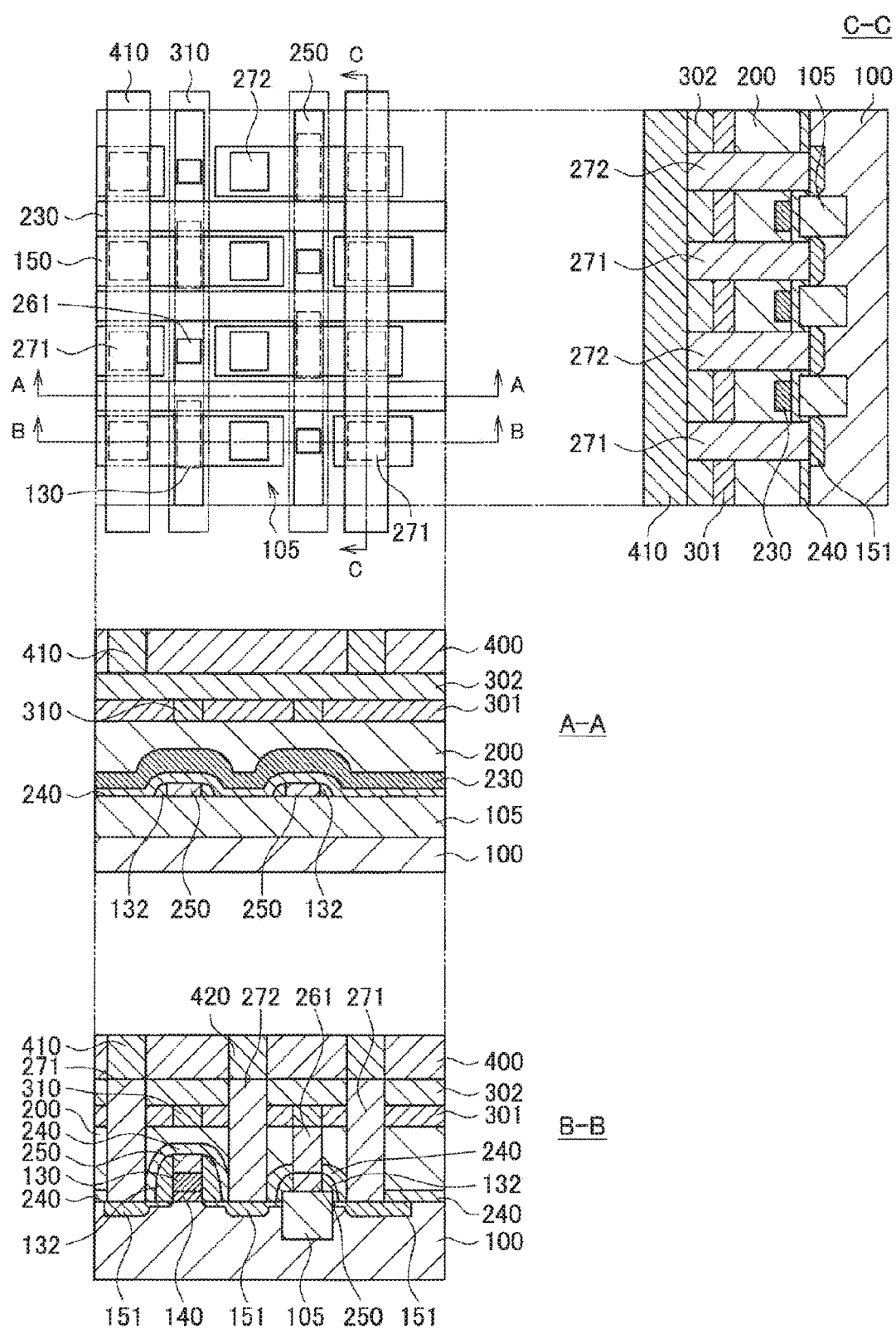
FIG. 12 is a plan view and a cross-sectional view explaining a process of a method for manufacturing the semiconductor storage apparatus according to the embodiment.

Next, as shown in FIG. 12, after forming the second interlayer film 400 on the upper first interlayer film 302, the second wiring layers 410 and 420 are formed.

Specifically, using CVD or the like, $SiO_2$ is formed over the entire surface of the semiconductor storage apparatus 10 on the upper first interlayer film 302 to a film thickness of 10 nm to 500 nm, and then planarized by the CMP method, so that the second interlayer film 400 is formed. Then, after forming an opening for forming an electrical connection with the contacts 271 and 272 in the second interlayer film 400 by etching, Cu or the like is used as a wiring material to form the second wiring layers 410 and 420 by using a damascene structure or a dual damascene structure. Note that the second wiring layers 410 and 420 may include Al or the like.

The second wiring layer 410 functions as the source line Vs by being provided on the contact 271 so as to extend in the second direction. Furthermore, the second wiring layer 420 electrically connects the via 511 formed in an upper layer and the contact 272.

Figure 13:
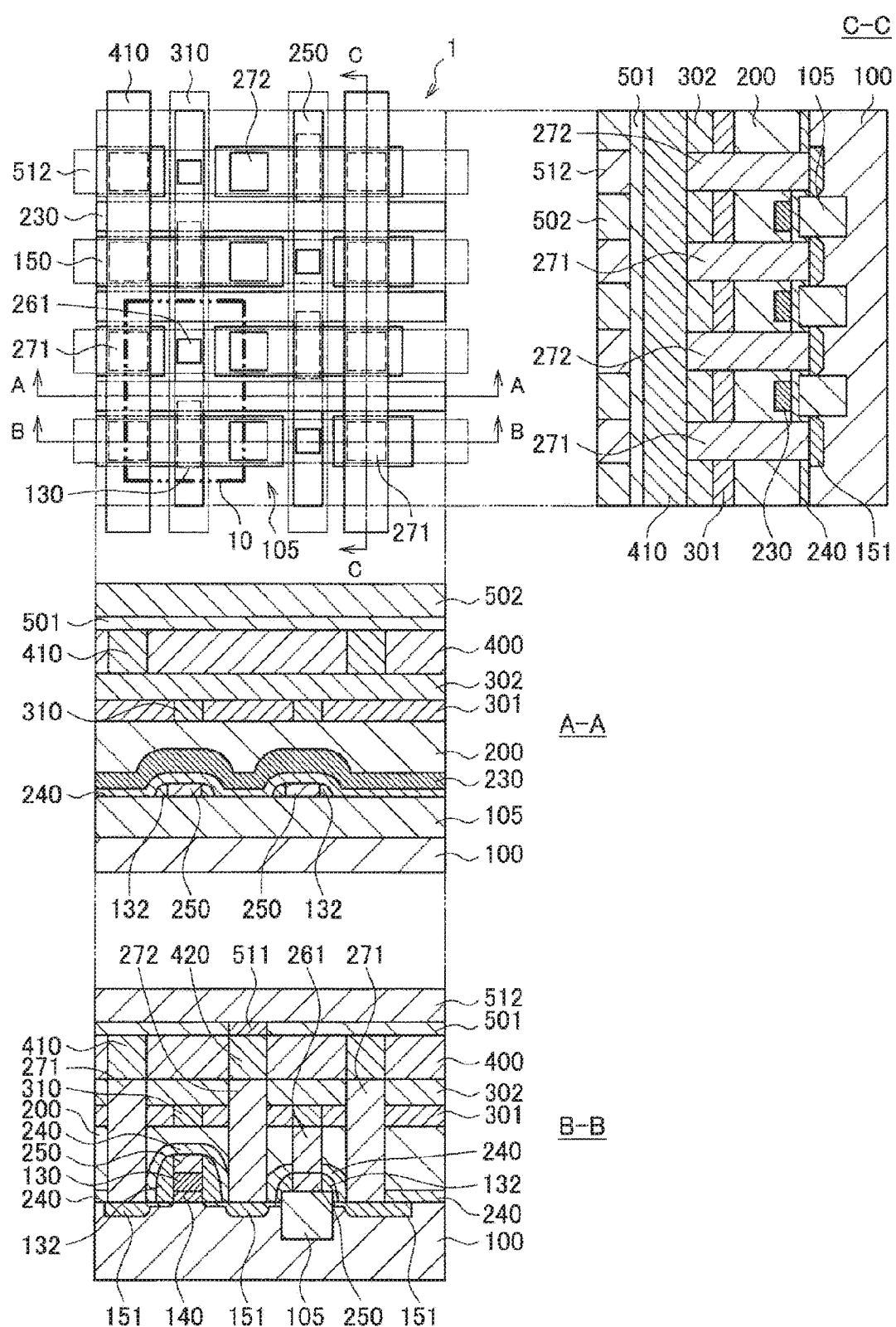
FIG. 13 is a plan view and a cross-sectional view explaining a process of a method for manufacturing the semiconductor storage apparatus according to the embodiment.

Subsequently, as shown in FIG. 13, after forming the lower third interlayer film 501 on the second interlayer film 400, the via 511 is formed. Thereafter, after forming an upper third interlayer film 502 on the lower third interlayer film 501, the third wiring layer 512 is formed.

Specifically, using CVD or the like, $SiO_2$ is formed over the entire surface of the semiconductor storage apparatus 10 on the second interlayer film 400 to a film thickness of 100 nm to 500 nm, and then planarized by the CMP method, so that the lower third interlayer film 501 is formed. Then, an opening for forming an electrical connection with the second wiring layer 420 is formed in the lower third interlayer film 501 by etching. Next, TiN is formed with respect to the formed opening by CVD or the like, W is further formed, and then planarized by the CMP, so that the via 511 is formed. Note that TiN may be formed by a sputtering method using IMP, or the like. Furthermore, planarization may be performed using entire surface etching back instead of CMP.

Next, using CVD or the like, $SiO_2$ is formed over the entire surface of the semiconductor storage apparatus 10 on the lower third interlayer film 501 to a film thickness of 100 nm to 500 nm, and then planarized by the CMP method, so that the upper third interlayer film 502 is formed. Next, after forming an opening for contact with the via 511 in the upper third interlayer film 502 by etching, Cu or the like is used as a wiring material to form the third wiring layer 512 by using a damascene structure or a dual damascene structure. Note that the third wiring layer 512 may include Al or the like.

Note that the third wiring layer 512 functions as the second bit line BL– by being provided on the via 511 so as to extend in the first direction.

By the above process, the semiconductor storage apparatus 10 according to the present embodiment can be formed.

4. VARIATIONS

Subsequently, a semiconductor storage apparatus 20 according to a variation of the present embodiment will be described with reference to FIGS. 14 to 18. FIGS. 14 to 17 are plan views and cross-sectional views explaining a process of a method for manufacturing the semiconductor storage apparatus 20. FIG. 18 is a schematic view showing a plane structure and a cross-sectional structure of the semiconductor storage apparatus 20.

Note that, in FIGS. 14 to 18, the illustration of the layers formed over the entire surface of the semiconductor storage apparatus 20 is omitted similarly to FIG. 2. Furthermore, each of the cross-sectional views and each of the cross-sectional views show a cross-section obtained by cutting the plan view along the line AA or the line BB.

As shown in FIG. 18, in the semiconductor storage apparatus 20 according to the variation, instead of the semiconductor substrate 100, a semiconductor layer 100A formed on a substrate is used. In the semiconductor storage apparatus 20, the memory cell can be multi-layered by repeatedly forming a stack structure from the semiconductor layer 100A to the upper first interlayer film 302. With this structure, in the storage apparatus 2 in which a large number of semiconductor storage apparatuses 20 is arranged in a matrix, it is possible to integrate memory cells at a higher density.

Note that, in the semiconductor storage apparatus 20 according to the variation, the respective configurations that are distinguished by being designated with "A" or "B" added to the reference numerals are substantially similar to the respective configurations of the semiconductor storage apparatus 10 that are not designated with "A" and "B" for the reference numerals, and therefore detailed description thereof will be omitted.

Hereinafter, a method for manufacturing the semiconductor storage apparatus 20 according to the variation will be briefly described.

Figure 14:
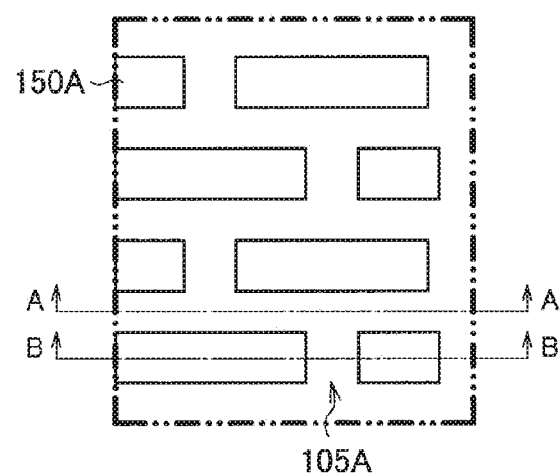
FIG. 14 is a plan view and a cross-sectional view explaining a process of a method for manufacturing a semiconductor storage apparatus according to a variation.
Figure 14:
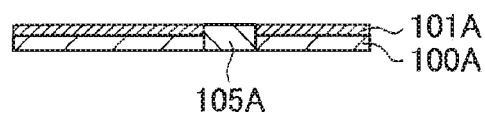
Figure 14:

First, as shown in FIG. 14, a semiconductor layer 100A is formed on a substrate, then an element isolation layer 105A is formed on the semiconductor layer 100A, and an activation region 150A in which the first transistor 11 is formed is formed.

Specifically, an amorphous silicon or a polysilicon film is formed on the substrate to a film thickness of 20 nm to 100 nm by using low pressure CVD with $SiH_4$ gas as a source gas at a film forming temperature of 580° C. to 620° C. The material of the substrate is not particularly limited, and other patterns, wirings, elements, or circuits may be formed on the substrate. For example, a circuit for driving the semiconductor storage apparatus 20 may be formed on the substrate.

Next, a $SiO_2$ film is formed on the semiconductor layer 100A by dry oxidation or the like, and a $Si_3N_4$ film is further formed by low pressure CVD or the like. Subsequently, a resist layer patterned so as to protect the activation region 150A is formed on the $Si_3N_4$ film, and the $SiO_2$ film, the $Si_3N_4$ film, and the semiconductor layer 100A are etched to the depth of the film thickness of the semiconductor layer 100A. Next, the element isolation layer 105A is formed by forming $SiO_2$ and filling the opening by etching. For forming the $SiO_2$ film, for example, high density plasma CVD which has favorable step coverage and is capable of forming a dense $SiO_2$ film may be used.

Then, the surface of the semiconductor layer 100A is planarized by removing the excessively formed $SiO_2$ film using chemical mechanical polish (CMP) or the like. It is sufficient if the removal of the $SiO_2$ film by CMP may be performed, for example, until the $Si_3N_4$ film is exposed.

Moreover, the $Si_3N_4$ film is removed using hot phosphoric acid or the like. Note that, in order to make the $SiO_2$ film of the element isolation layer 105A a denser film or to round the corners of the activation region 150A, the semiconductor layer 100A can also be annealed under $N_2$, $O_2$, or $H_2/O_2$ environment before the removal of the $Si_3N_4$ film. Next, the surface of the semiconductor layer 100A of the activation region 150A is oxidized about 10 nm to form an oxide film 101A.

Figure 15:
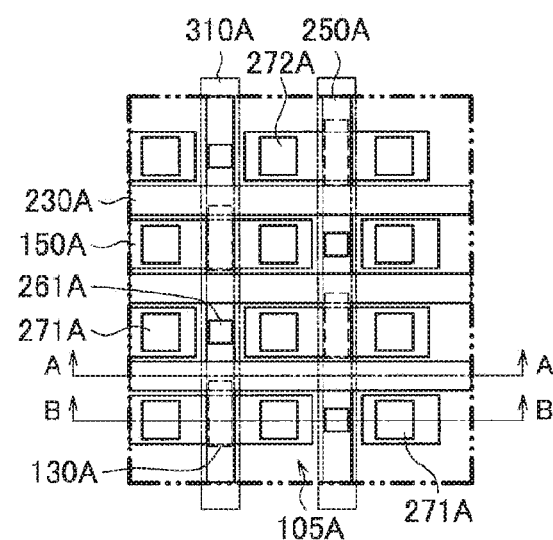
FIG. 15 is a plan view and a cross-sectional view explaining a process of a method for manufacturing a semiconductor storage apparatus according to a variation.
Figure 15:
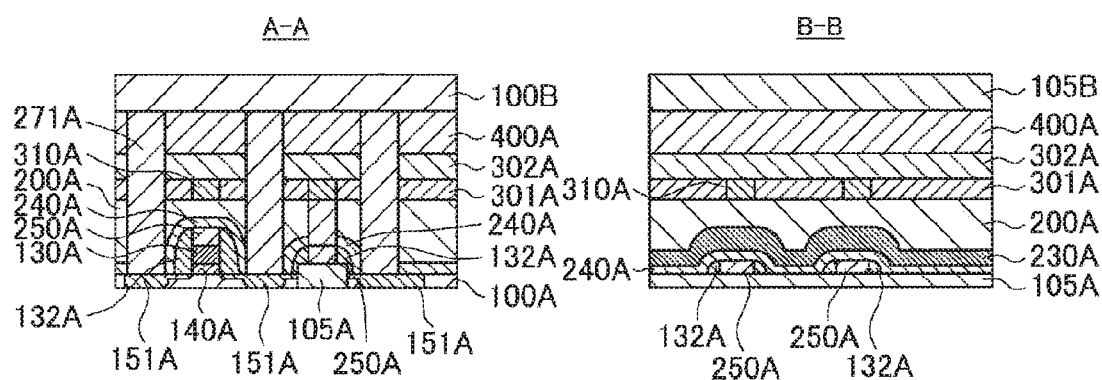

Next, as shown in FIG. 15, the process described with reference to FIGS. 3 to 11 is performed to form the first transistor 11 and the second transistor 12 on the semiconductor layer 100A. Thereafter, a semiconductor layer 100B is formed.

Specifically, after forming up to a second interlayer film 400A, the surfaces of the contacts 271A and 272A are retreated (recessed) by etching or the like, and Ti is deposited about 5 nm to 20 nm by CVD or the like. Thereafter, the deposited Ti is planarized by CMP or the like. Note that cobalt (Co) or the like having high heat resistance may be used instead of titanium (Ti).

Thereafter, an amorphous silicon or a polysilicon film is formed on the second interlayer film 400A to a film thickness of 20 nm to 100 nm by using low pressure CVD with $SiH_4$ gas as a source gas at a film forming temperature of 580° C. to 620° C. The formed amorphous silicon or polysilicon becomes the semiconductor layer 100B, which is a second layer.

Figure 16:
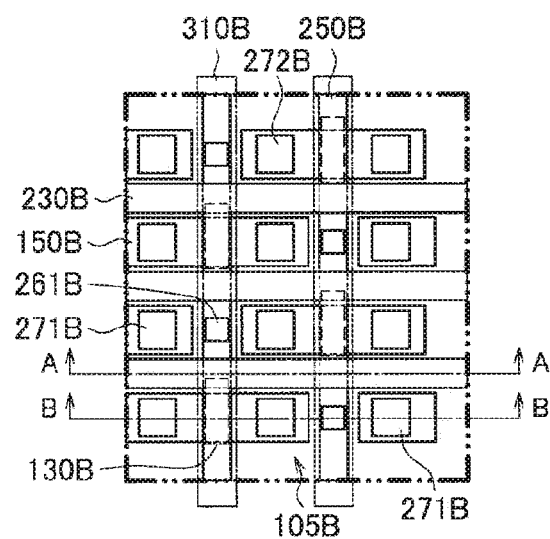
FIG. 16 is a plan view and a cross-sectional view explaining a process of a method for manufacturing a semiconductor storage apparatus according to a variation.
Figure 16:
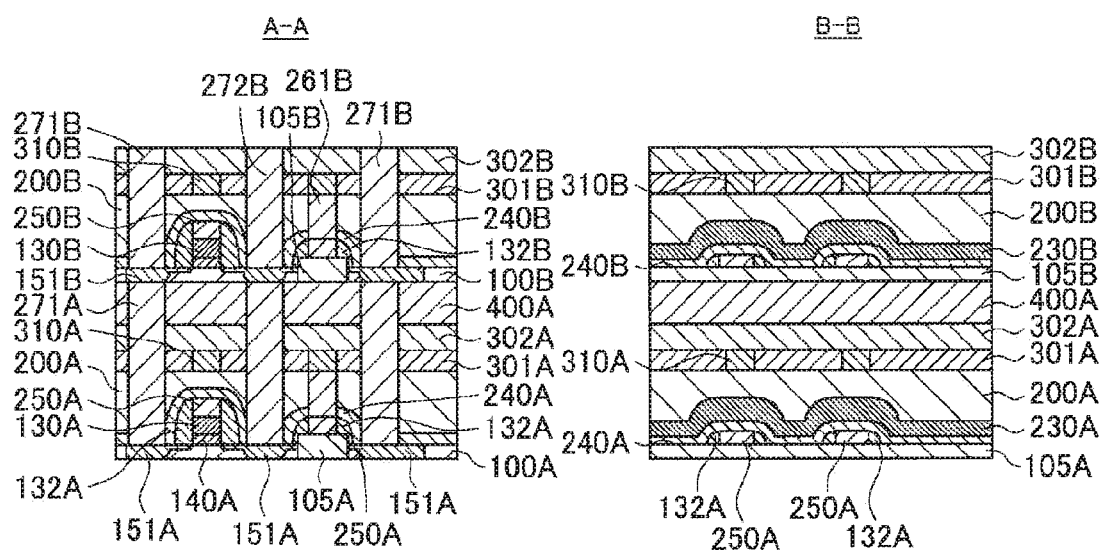

Subsequently, as shown in FIG. 16, the process described with reference to FIGS. 2 to 11 is performed to form a first transistor 11B and a second transistor 12B on the semiconductor layer 100B.

Figure 17:
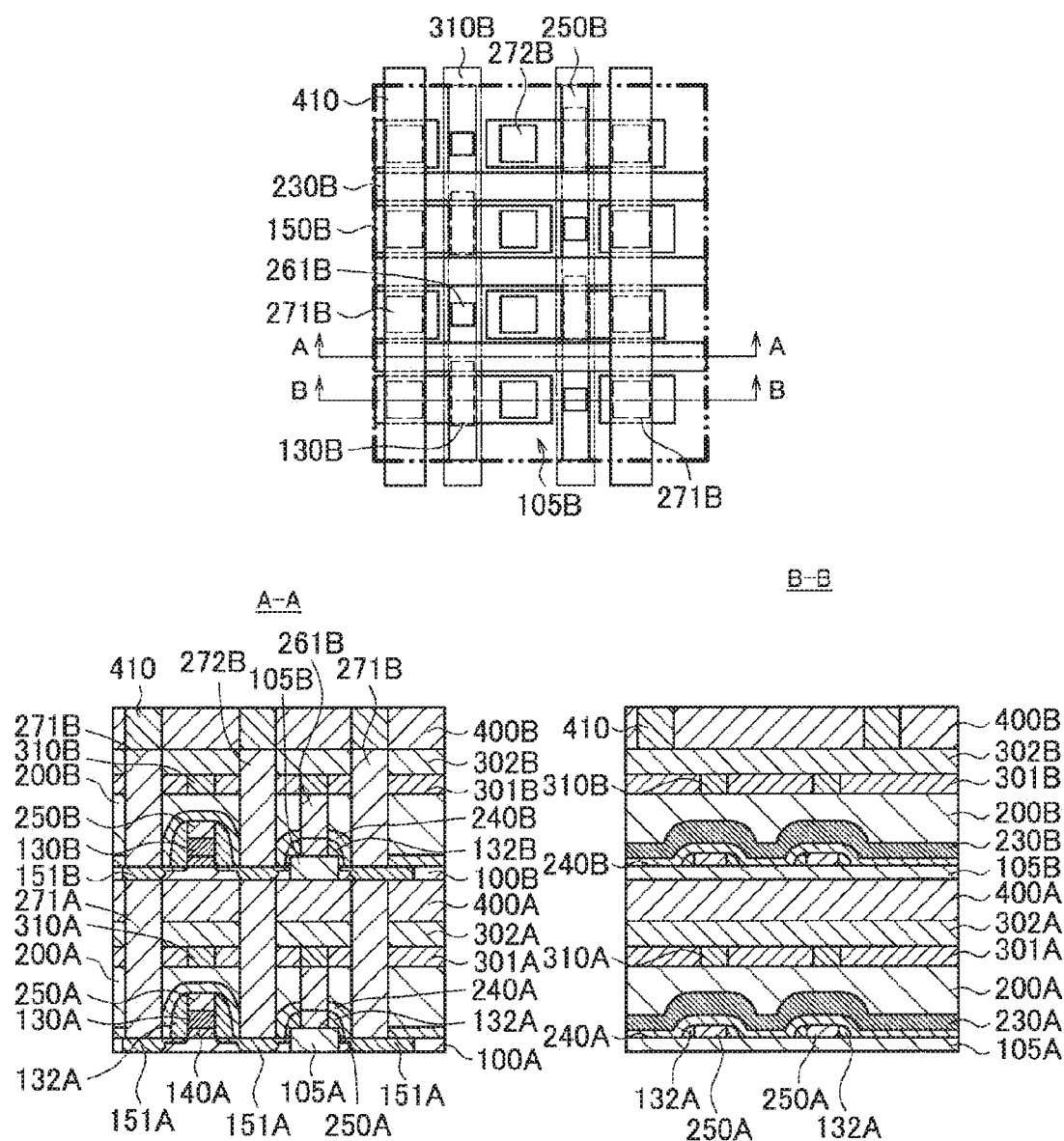
FIG. 17 is a plan view and a cross-sectional view explaining a process of a method for manufacturing a semiconductor storage apparatus according to a variation.
Figure 18:
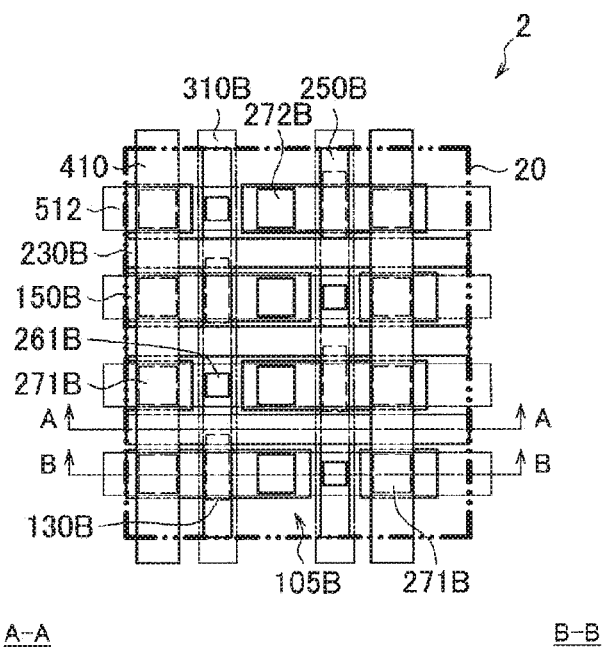
FIG. 18 is a schematic diagram showing a plane structure and a cross-sectional structure of a semiconductor storage apparatus according to a variation.
Figure 18:
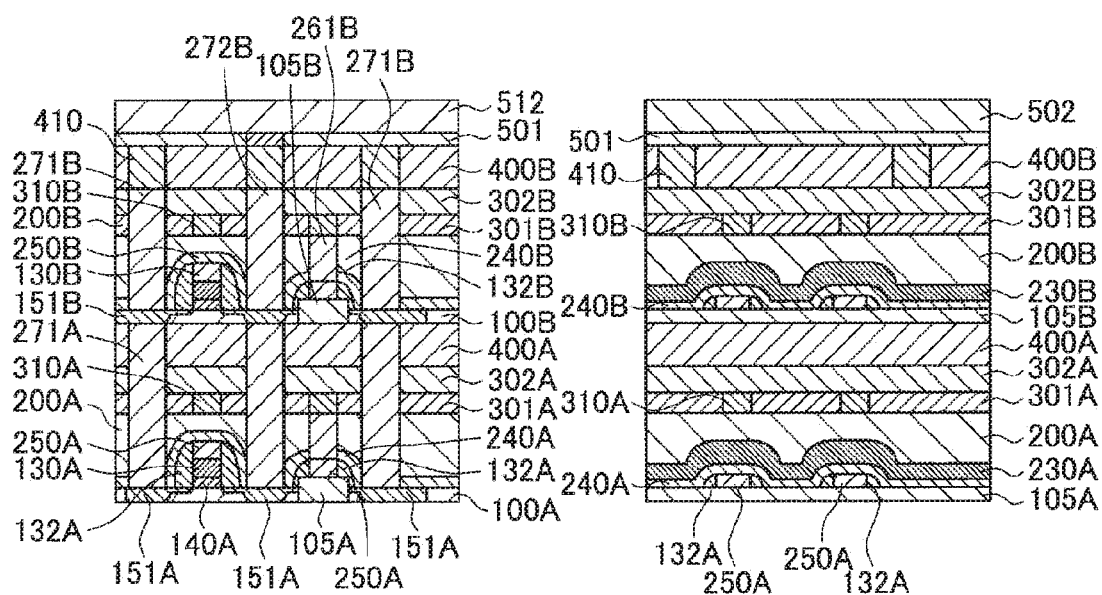

Next, as shown in FIG. 17, after forming a second interlayer film 400B on an upper first interlayer film 302B, the second wiring layers 410 and 420 are formed.

Specifically, using CVD or the like, $SiO_2$ is formed over the entire surface of the semiconductor storage apparatus 20 on the upper first interlayer film 302B to a film thickness of 10 nm to 500 nm, and then planarized by the CMP method, so that a second interlayer film 400B is formed. Then, after forming an opening for forming an electrical connection with the contacts 271B and 272B in the second interlayer film 400B by etching, Cu or the like is used as a wiring material to form the second wiring layers 410 and 420 by using a damascene structure or a dual damascene structure. Note that the second wiring layers 410 and 420 may include Al or the like.

The second wiring layer 410 functions as the source line Vs by being provided on the contact 271B so as to extend in the second direction. Furthermore, the second wiring layer 420 electrically connects the via 511 formed in an upper layer and the contact 272B.

Subsequently, as shown in FIG. 18, after forming the lower third interlayer film 501 on the second interlayer film 400B, the via 511 is formed. Thereafter, after forming an upper third interlayer film 502 on the lower third interlayer film 501, the third wiring layer 512 is formed.

Specifically, using CVD or the like, $SiO_2$ is formed over the entire surface of the semiconductor storage apparatus 20 on the second interlayer film 400B to a film thickness of 100 nm to 500 nm, and then planarized by the CMP method, so that the lower third interlayer film 501 is formed. Then, an opening for forming an electrical connection with the second wiring layer 420 is formed in the lower third interlayer film 501 by etching. Next, TiN is formed with respect to the formed opening by CVD or the like, W is further formed, and then planarized by the CMP, so that the via 511 is formed. Note that TiN may be formed by a sputtering method using IMP, or the like. Furthermore, planarization may be performed using entire surface etching back instead of CMP.

Next, using CVD or the like, $SiO_2$ is formed over the entire surface of the semiconductor storage apparatus 20 on the lower third interlayer film 501 to a film thickness of 100 nm to 500 nm, and then planarized by the CMP method, so that the upper third interlayer film 502 is formed. Next, after forming an opening for contact with the via 511 in the upper third interlayer film 502 by etching, Cu or the like is used as a wiring material to form the third wiring layer 512 by using a damascene structure or a dual damascene structure. Note that the third wiring layer 512 may include Al or the like. Note that the third wiring layer 512 functions as the second bit line BL– by being provided on the via 511 so as to extend in the first direction.

By the above process, the semiconductor storage apparatus 20 according to the variation can be formed. The semiconductor storage apparatus 20 according to the variation can achieve higher integration by further repeating the stack structure of the first transistor 11 and the second transistor 12.

5. OPERATION EXAMPLE

Next, a write operation and a read operation of the semiconductor storage apparatus 10 described above will be described. Table 1 below is a table showing an example of voltages (unit: V) applied to each wiring in the write operation and the read operation of the semiconductor storage apparatus 10.

In Table 1, the word line, the first bit line, and the second bit line of a selected memory cell are described as SWL, SBL, and SBL–, respectively. Furthermore, the word line, the first bit line, and the second bit line of an unselected memory cell are described as UWL, UBL, and UBL–, respectively. Moreover, the source line is described as Vs.

TABLE 1

|  | SWL | SBL | SBL– | Vs | UWL | UBL | UBL– |
|---|---|---|---|---|---|---|---|
| WRITING "1" | 3.5 | 3.0 | 0 | 0 | 0 | 0 | 0 |
| WRITING "0" | 3.5 | 0 | 3.0 | 0 | 0 | 0 | 0 |
| READING | 1.5 | 1.0 | 1.0 | 1.0 | 0 | 0 | 0 |

In a case where information "1" is written in the memory cell of the semiconductor storage apparatus 10, for example, as shown in Table 1, 3.5 V is applied to the word line WL connected to the selected memory cell, 3.0 V is applied to the first bit line BL, and 0 V is applied to the second bit line BL–. Note that 0 V is applied to the source line Vs.

In such a case, the potential of the first bit line BL is transmitted to the first gate electrode 130 of the first transistor 11 via the second transistor 12, which is in the ON state. Furthermore, the potential of the second bit line BL– is transmitted to the source or drain region 151 of the first transistor 11. Therefore, an external electric field having a high potential on the first gate electrode 130 side is generated in the ferroelectric film 140 of the first transistor 11, and the polarization state of the ferroelectric film 140 is controlled. Therefore, the semiconductor storage apparatus 10 can write, for example, information "1" in the selected memory cell.

On the other hand, in a case where "0" information is written in the memory cell of the semiconductor storage apparatus 10, for example, as shown in Table 1, 3.5 V is applied to the word line WL connected to the selected memory cell, 0 V is applied to the first bit line BL, and 3.0 V is applied to the second bit line BL−. Note that 0 V is applied to the source line Vs.

In such a case, the potential of the first bit line BL is transmitted to the first gate electrode 130 of the first transistor 11 via the second transistor 12, which is in the ON state. Furthermore, the potential of the second bit line BL− is transmitted to the source or drain region 151 of the first transistor 11. Therefore, an external electric field having a low potential on the first gate electrode 130 side is generated in the ferroelectric film 140 of the first transistor 11, and the polarization state of the ferroelectric film 140 is controlled. Therefore, the semiconductor storage apparatus 10 can write, for example, information "0" in the selected memory cell.

Here, in the unselected memory cell connected to the word line WL, since no voltage is applied to the first bit line BL and the second bit line BL−, an electric field does not occur in the ferroelectric film 140 of the first transistor 11. Furthermore, in the unselected memory cell connected to the first bit line BL or the second bit line BL−, the voltage is applied to the first bit line BL and the second bit line BL−, but because the second transistor 12 is in the OFF state, no electric field occurs in the ferroelectric film 140 of the first transistor 11.

Furthermore, in a case where information is read from the semiconductor storage apparatus 10, as shown in Table 1, 1.5 V is applied to the word line WL connected to the selected memory cell, 1.0 V is applied to the first bit line BL, and 1.0 V is applied to the second bit line BL−. Note that, for example, 1.0 V is applied to the source line Vs.

In such a case, the potential of the first bit line BL is transmitted to the first gate electrode 130 of the first transistor 11 via the second transistor 12, and the first transistor 11 becomes the ON state. Furthermore, in the first transistor 11, the threshold voltage Vt changes depending on the direction of the remanent polarization of the ferroelectric film 140, and, for example, in a case where information "1" is stored above, Vt becomes low, and in a case where information of "0" is stored above, Vt becomes high.

With this arrangement, in the first transistor 11, the amount of current flowing between the second bit line BL− and the source line Vs changes depending on the direction of the remanent polarization of the ferroelectric film 140. Therefore, it can be determined whether the information stored in the ferroelectric film 140 of the first transistor 11 is "1" or "0" according to the amount of current flowing between the second bit line BL− and the source line Vs.

Note that, in the unselected memory cell connected to the word line WL, since no voltage is applied to the first bit line BL and the second bit line BL−, no voltage is applied to the first gate electrode 130 of the first transistor 11. Furthermore, in the unselected memory cells connected to the first bit line BL and the second bit line BL−, because the second transistor 12 is in the OFF state, no voltage is applied to the first gate electrode 130 of the first transistor 11.

As described above, in the semiconductor storage apparatus 10, since the source or drain of the second transistor 12 is connected to the gate of the first transistor 11 that stores information, the generation of an electric field in the ferroelectric film 140 of the first transistor 11 can be controlled. Therefore, in the semiconductor storage apparatus 10, it is possible to prevent the information stored in the unselected memory cells from being disrupted (or disturbed) when information is written in or read from the selected memory cells.

Note that in a case where the leak current of the first transistor 11 along the second bit line BL− is larger than the current flowing between the second bit line BL− and the source line Vs at the time of reading information, it can be difficult to determine the information. In the semiconductor storage apparatus 10 according to the present embodiment, since the word line WL of each memory cell can be formed independently, it is possible to control the leak current of the first transistor 11 by the word line WL. Moreover, in a case where the negative word line technique of applying a negative voltage to the word line WL of the unselected memory cell is applied, the leak current of the first transistor 11 can be further reduced.

6. APPLICATION EXAMPLE

Subsequently, an application example of the semiconductor storage apparatus 10 according to the present embodiment will be described with reference to FIGS. 19, 20, 21A, 21B, and 21C.

(Example of Application to Product-Sum Calculation Apparatus)

Figure 19:
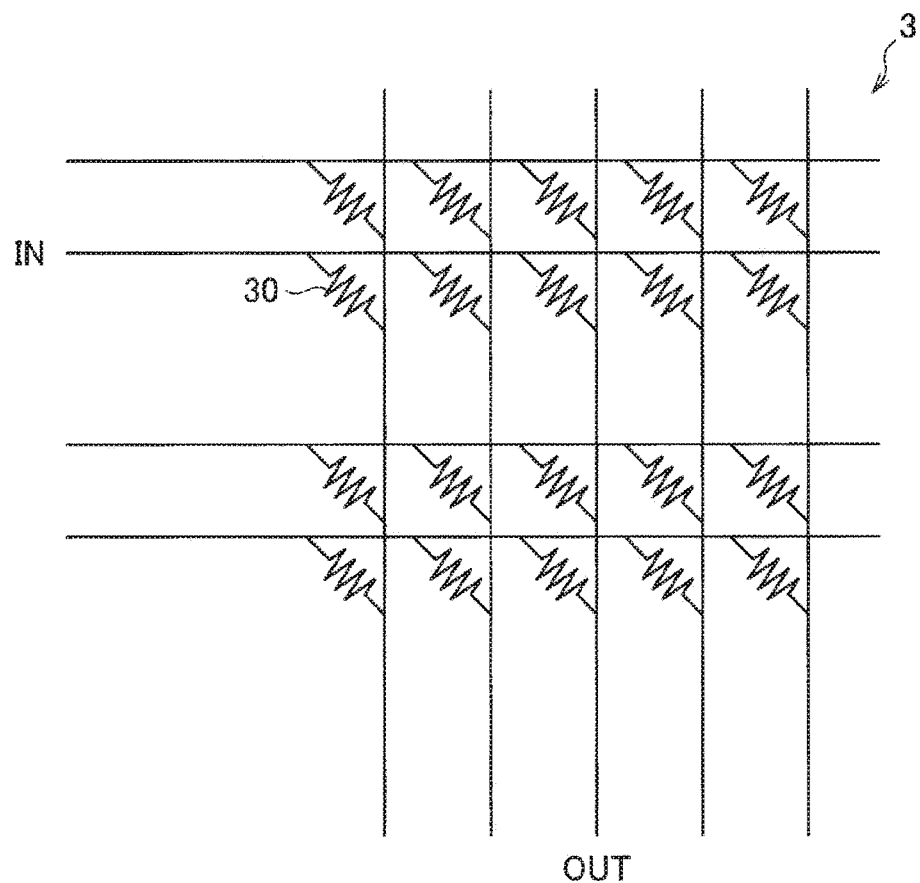
FIG. 19 is a schematic circuit diagram showing an equivalent circuit of a product-sum calculation apparatus.
Figure 20:
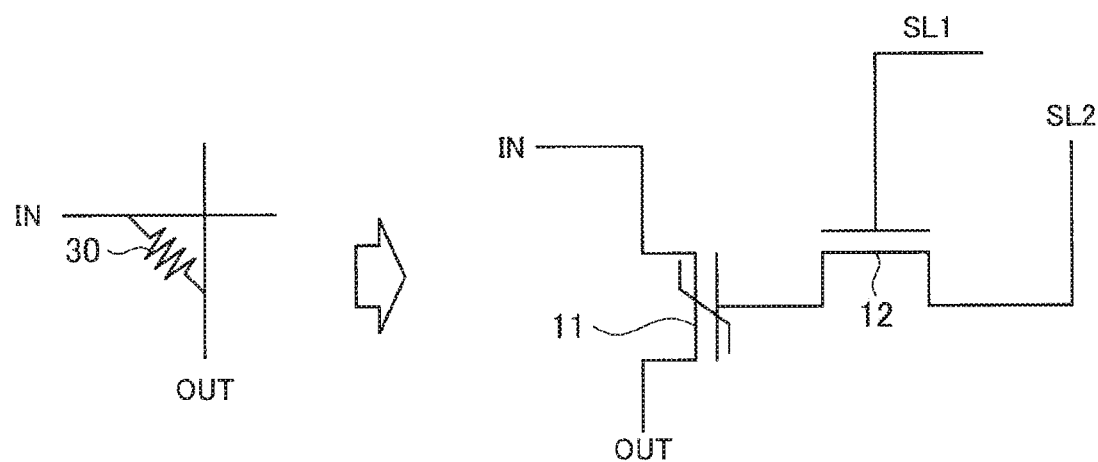
FIG. 20 is a schematic diagram explaining application of the semiconductor storage apparatus according to an embodiment of the present disclosure to a product-sum calculation apparatus.

The semiconductor storage apparatus 10 according to the present embodiment can be used, for example, as a product-sum calculation apparatus. The application of the semiconductor storage apparatus 10 according to the present embodiment to a product-sum calculation apparatus will be described with reference to FIGS. 19 and 20. FIG. 19 is a schematic circuit diagram showing an equivalent circuit of a product-sum calculation apparatus. FIG. 20 is a schematic diagram explaining application of the semiconductor storage apparatus 10 according to the present embodiment to a product-sum calculation apparatus.

As shown in FIG. 19, a product-sum calculation apparatus 3 includes a plurality of input lines extending in a first direction (for example, a row direction), a plurality of output lines extending in a second direction (for example, a column direction) orthogonal to the first direction, and resistors 30 provided at the intersections of the input lines and the output lines.

The product-sum calculation apparatus 3 can perform product-sum calculation by weighting each cell with a resistance value of the resistor 30. Such a product-sum calculation apparatus 3 can implement, for example, a neural network (also called an artificial neural network) that imitates a neural network of a living body as an analog circuit. Note that the circuit element that realizes the neural network is also called a neuromorphic element.

Here, as shown in FIG. 20, the resistor 30 provided at the intersection of the input line and the output line can be configured by a resistance change memory in which the resistance value can be overwritten to reflect the learning result. Since the semiconductor storage apparatus 10 according to the present embodiment is a nonvolatile resistance change memory capable of changing the channel resistance of the first transistor 11, it can be applied as the resistor 30 constituting each cell of the product-sum calculation apparatus 3.

Specifically, in a case where the semiconductor storage apparatus 10 is applied to the resistor 30 that constitutes each cell of the product-sum calculation apparatus 3, the source or drain of the first transistor 11 corresponds to the input line or the output line. The gate of the second transistor 12 corresponds to a first selection line SL1 for selecting a cell, and the other of the source and the drain of the second transistor 12 corresponds to a second selection line SL2 for selecting a cell.

Subsequently, a write operation and a calculation operation in a case where the semiconductor storage apparatus 10 is applied to the product-sum calculation apparatus 3 will be described. Table 2 below is a table showing an example of voltages (unit: V) applied to each wiring in the write operation and the calculation operation in a case where the semiconductor storage apparatus 10 is applied to the product-sum calculation apparatus 3.

In Table 2, the first selection line, the second selection line, and the input line of the selected cell are described as SSL1, SSL2, and SIN, respectively. Furthermore, the first selection line, the second selection line, and the input line of the unselected cell are described as USL1, USL2, and UIN, respectively. Moreover, the output line is described as OUT.

TABLE 2

|  | SSL1 | SSL2 | SIN | OUT | USL1 | USL2 | UIN |
|---|---|---|---|---|---|---|---|
| WRITING "1" | 3.5 | 3.0 | 0 | 0 | 0 | 0 | 0 |
| WRITING "0" | 3.5 | 0 | 3.0 | 3.0 | 0 | 0 | 0 |
| CALCULATION | 1.5 | 1.0 | 1.0 | 0 | 0 | 0 | 0 |

In a case where information "1" is written in the cell configured by the semiconductor storage apparatus 10, for example, as shown in Table 2, 3.5 V is applied to the first selection line SL1 connected to the selected cell, 3.0 V is applied to the second selection line SL2, and 0 V is applied to the input line IN. Furthermore, the output line OUT is 0 V.

In such a case, the potential of the second selection line SL2 is transmitted to the first gate electrode 130 of the first transistor 11 via the second transistor 12, which is in the ON state. Furthermore, the potential of the input line IN is transmitted to the source or drain region 151 of the first transistor 11. Therefore, an external electric field having a high potential on the first gate electrode 130 side is generated in the ferroelectric film 140 of the first transistor 11, and the polarization state of the ferroelectric film 140 is controlled. With this arrangement, for example, information "1" can be written in the cell configured by the semiconductor storage apparatus 10.

On the other hand, in a case where information "0" is written in the memory cell of the semiconductor storage apparatus 10, as shown in Table 2, 3.5 V is applied to the first selection line SL1 connected to the selected cell, 0 V is applied to the second selection line SL2, and 3.0 V is applied to the input line IN. Furthermore, the output line OUT is 3.0 V.

In such a case, the potential of the second selection line SL2 is transmitted to the first gate electrode 130 of the first transistor 11 via the second transistor 12, which is in the ON state. Furthermore, the potential of the input line IN is transmitted to the source or drain region 151 of the first transistor 11. Therefore, an external electric field having a low potential on the first gate electrode 130 side is generated in the ferroelectric film 140 of the first transistor 11, and the polarization state of the ferroelectric film 140 is controlled. With this arrangement, for example, information "0" can be written in the cell configured by the semiconductor storage apparatus 10.

Note that 0 V is applied to each of the first selection line, the second selection line, and the input line of the unselected cell. With this arrangement, the semiconductor storage apparatus 10 can prevent the occurrence of Disturb (Write Disturb) in the unselected cells.

Furthermore, in a case where product-sum calculation is performed using the cell configured by the semiconductor storage apparatus 10, as shown in Table 2, 1.5 V is applied to the first selection line SL1 connected to the selected cell and 1.0 V is applied to the second selection line SL2. Furthermore, 1.0 V is applied to the input line IN.

In such a case, the potential of the second selection line SL2 is transmitted to the first gate electrode 130 of the first transistor 11 via the second transistor 12, which is in the ON state, and the first transistor 11 becomes the ON state. In the first transistor 11, the threshold voltage Vt changes depending on the direction of the remanent polarization of the ferroelectric film 140, and, for example, in a case where information "1" is stored above, Vt becomes low, and in a case where information of "0" is stored above, Vt becomes high. Therefore, the product-sum calculation apparatus can obtain the calculation result according to the data stored in the semiconductor storage apparatus 10 by the amount of current (or resistance value) flowing between the input line IN and the output line OUT.

Note that 0 V is applied to each of the first selection line, the second selection line, and the input line of the unselected cell. With this arrangement, the semiconductor storage apparatus 10 can prevent the occurrence of Disturb (Read Disturb) in the unselected cells.

(Examples of Application to Electronic Equipment)

Figure 21A:
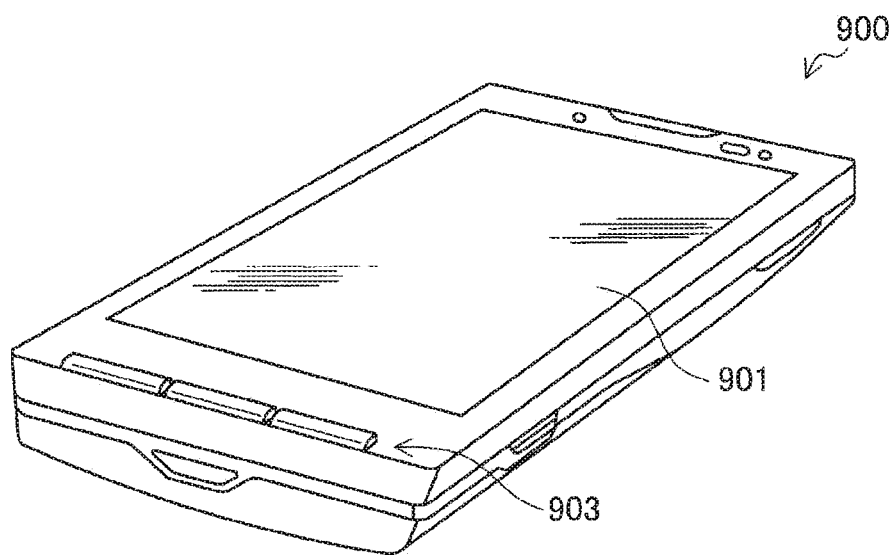
FIG. 21A is an external view showing an example of electronic equipment in which the semiconductor storage apparatus according to the embodiment is mounted.
Figure 21B:
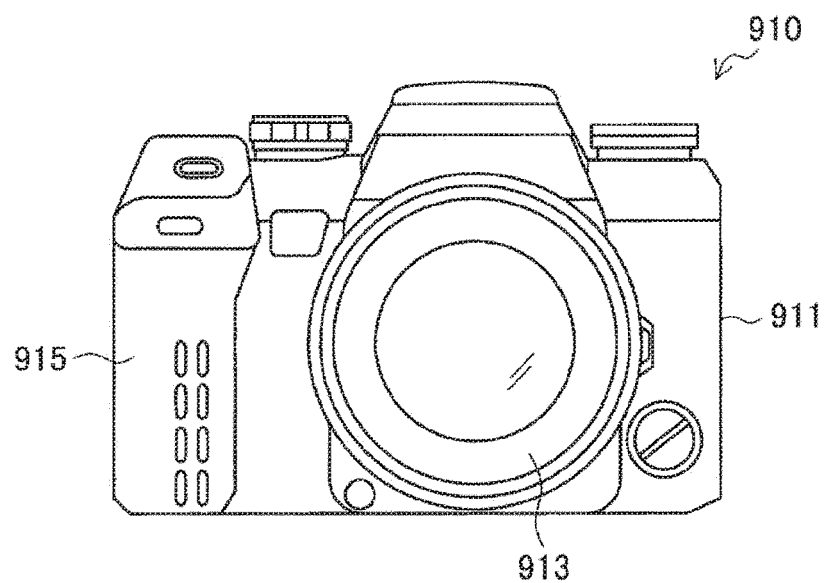
FIG. 21B is an external view showing an example of electronic equipment in which the semiconductor storage apparatus according to the embodiment is mounted.
Figure 21C:
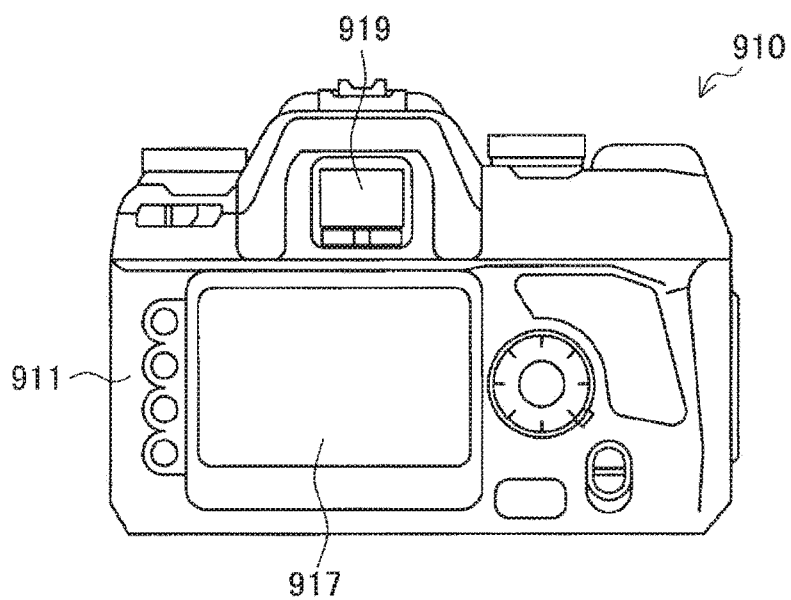
FIG. 21C is an external view showing an example of electronic equipment in which the semiconductor storage apparatus according to the embodiment is mounted.

Furthermore, the semiconductor storage apparatus 10 according to the present embodiment can be mounted in a circuit included in various pieces of electronic equipment. With reference to FIGS. 21A, 21B, and 21C, an example of the electronic equipment in which such a semiconductor storage apparatus 10 is mounted will be described. FIGS. 21A, 21B, and 21C are external views showing an example of electronic equipment in which the semiconductor storage apparatus 10 is mounted.

For example, the electronic equipment in which the semiconductor storage apparatus 10 is mounted may be electronic equipment such as a smartphone. Specifically, as shown in FIG. 21A, a smartphone 900 includes a display unit 901 that displays various types of information, and an operation unit 903 that includes buttons and the like for receiving an operation input by the user. Here, the semiconductor storage apparatus 10 described above may be provided in the circuit mounted on the smartphone 900.

For example, the electronic equipment in which the semiconductor storage apparatus 10 is mounted may be electronic equipment such as a digital camera. Specifically, as shown in FIGS. 21B and 21C, a digital camera 910 includes a main body (camera body) 911, a replaceable lens unit 913, a grip portion 915 held by the user at the time of capturing, and a monitor unit 917 for displaying various types of information, and an electronic view finder (EVF) 919 for displaying a through image observed by the user at the time of capturing. Note that FIG. 21B is an external view of the digital camera 910 viewed from the front (that is, the subject side), and FIG. 21C is an external view of the digital camera 910 viewed from the rear (that is, the capturer side).

Here, the semiconductor storage apparatus 10 described above may be provided in the circuit mounted on the digital camera 910.

Note that the electronic equipment in which the semiconductor storage apparatus 10 is mounted is not limited to the above example. The electronic equipment in which the semiconductor storage apparatus 10 is mounted may be electronic equipment of any field. Examples of such electronic equipment include, for example, eyeglass-type wearable devices, head mounted displays (HMDs), television apparatuses, electronic books, personal digital assistants (PDAs), notebook personal computers, video cameras, game devices, and the like.

The preferred embodiments of the present disclosure have been described above with reference to the accompanying drawings, while the technical scope of the present disclosure is not limited to the above examples. A person skilled in the art may find various alterations and variations within the scope of the appended claims, and it should be understood that they will naturally come under the technical scope of the present disclosure.

Furthermore, the effects described in this specification are merely illustrative or exemplified effects, and are not limitative. That is, with or in the place of the above effects, the technology according to the present disclosure may achieve other effects that are clear to those skilled in the art from the description of this specification.

Note that the configuration below also falls within the technical scope of the present disclosure.

(1)

A semiconductor storage apparatus including:

a first transistor including a first gate electrode via a ferroelectric film on an activation region including source or drain regions; and a second transistor including source or drain regions in an activation layer provided on the first gate electrode and a second gate electrode on the activation layer via an insulating film.

(2)

The semiconductor storage apparatus according to (1), in which the activation region is provided on a semiconductor substrate so as to extend in a first direction.

(3)

The semiconductor storage apparatus according to (2), in which the activation layer includes a semiconductor material.

(4)

The semiconductor storage apparatus according to (2) or (3), in which the first gate electrode is provided so as to extend in a second direction orthogonal to the first direction.

(5)

The semiconductor storage apparatus according to (4), in which the second gate electrode is provided so as to extend in the first direction.

(6)

The semiconductor storage apparatus according to (4) or (5), in which one of the source or drain regions of the first transistor is electrically connected to a source line extending in the second direction, and another of the source or drain regions of the first transistor is electrically connected to a second bit line extending in the first direction.

(7)

The semiconductor storage apparatus according to (4) or (5), in which one of the source or drain regions of the second transistor is electrically connected to the first gate electrode, and another of the source or drain regions of the second transistor is electrically connected to a first bit line extending in the second direction.

(8)

The semiconductor storage apparatus according to any one of (2) to (7), in which the source or drain regions of the first transistor are provided in the activation region on both sides of the first gate electrode, and the source or drain regions of the second transistor are provided in the activation layer on both sides of the second gate electrode.

(9)

The semiconductor storage apparatus according to any one of (2) to (8), in which the activation layer is provided on the first gate electrode and the semiconductor substrate along an outer shape of the first gate electrode and the semiconductor substrate.

(10)

The semiconductor storage apparatus according to any one of (2) to (9), in which the second gate electrode is provided on the activation layer and the semiconductor substrate along an outer shape of the activation layer and the semiconductor substrate via the insulating film.

(11)

The semiconductor storage apparatus according to any one of (1) to (10), in which each of the source or drain regions of the first transistor and the second transistor is provided as a same conductivity type region.

(12)

The semiconductor storage apparatus according to any one of (1) to (11), in which the second transistor is provided as a thin film transistor.

(13)

The semiconductor storage apparatus according to any one of (1) to (12), in which a plurality of sets of the first transistor and the second transistor is provided by a repetition of stacking.

(14)

A product-sum calculation apparatus including:

a first transistor including a first gate electrode via a ferroelectric film on an activation region including source or drain regions; and a second transistor including source or drain regions in an activation layer provided on the first gate electrode and a second gate electrode on the activation layer via an insulating film.

(15)

Electronic equipment including:

a semiconductor storage apparatus including:

a first transistor including a first gate electrode via a ferroelectric film on an activation region including source or drain regions; and a second transistor including source or drain regions in an activation layer provided on the first gate electrode and a second gate electrode on the activation layer via an insulating film.

REFERENCE SIGNS LIST

1, 2 Storage apparatus
3 Product-sum calculation apparatus
10, 20 Semiconductor storage apparatus
11 First transistor
12 Second transistor 30 Resistor
100 Semiconductor substrate
105 Element isolation layer
130 First gate electrode
132 Sidewall insulating film
140 Ferroelectric film
150 Activation region
151 Source or drain region
200 Planarized film
230 Second gate electrode
240 Gate insulating film
250 Activation layer
261, 271, 272 Contact
301 Lower first interlayer film
302 Upper first interlayer film
310 First wiring layer
400 Second interlayer film
410, 420 Second wiring layer
501 Lower third interlayer film
502 Upper third interlayer film
511 Via
512 Third wiring layer

The invention claimed is:

1. A semiconductor storage apparatus, comprising:
a first transistor including:
   a ferroelectric film on an activation region, wherein the activation region extends in a first direction on a semiconductor substrate;
   a first source region or a first drain region in the activation region; and
   a first gate electrode on the ferroelectric film, wherein the first gate electrode extends in a second direction orthogonal to the first direction; and
a second transistor including:
   an activation layer on the first gate electrode;
   a second source region or a second drain region in the activation layer;
   an insulating film on the activation layer; and
   a second gate electrode on the activation layer via the insulating film.

2. The semiconductor storage apparatus according to claim 1, wherein the activation layer includes a semiconductor material.

3. The semiconductor storage apparatus according to claim 1, wherein the second gate electrode extends in the first direction.

4. The semiconductor storage apparatus according to claim 1, wherein
one of the first source region or the first drain region of the first transistor is electrically connected to a source line that extends in the second direction, and
another of the first source region or the first drain region of the first transistor is electrically connected to a second bit line that extends in the first direction.

5. The semiconductor storage apparatus according to claim 1, wherein
one of the second source region or the second drain region of the second transistor is electrically connected to the first gate electrode, and
another of the second source region or the second drain region of the second transistor is electrically connected to a first bit line that extends in the second direction.

6. The semiconductor storage apparatus according to claim 1, wherein
the first source region or the first drain region of the first transistor are in the activation region on both sides of the first gate electrode, and
the second source region or the second drain region of the second transistor are in the activation layer on both sides of the second gate electrode.

7. The semiconductor storage apparatus according to claim 1, wherein the activation layer is on the first gate electrode and the semiconductor substrate along an outer shape of the first gate electrode and the semiconductor substrate.

8. The semiconductor storage apparatus according to claim 1, wherein the second gate electrode is on the activation layer and the semiconductor substrate along an outer shape of the activation layer and the semiconductor substrate via the insulating film.

9. The semiconductor storage apparatus according to claim 1, wherein
each of the first source region or the first drain region of the first transistor is a same conductivity type region, and
each of the second source region or the second drain region of the second transistor is a same conductivity type region.

10. The semiconductor storage apparatus according to claim 1, wherein the second transistor is a thin film transistor.

11. The semiconductor storage apparatus according to claim 1, wherein a plurality of sets of the first transistor and the second transistor is repeatedly stacked.

12. A product-sum calculation apparatus, comprising:
a first transistor including:
   a ferroelectric film on an activation region, wherein the activation region extends in a first direction on a semiconductor substrate;
   a first source region or a first drain region in the activation region; and
   a first gate electrode on the ferroelectric film, wherein the first gate electrode extends in a second direction orthogonal to the first direction; and
a second transistor including:
   an activation layer on the first gate electrode;
   a second source region or a second drain region in the activation layer;
   an insulating film on the activation layer; and
   a second gate electrode on the activation layer via the insulating film.

13. An electronic equipment, comprising:
a semiconductor storage apparatus including:
   a first transistor including:
      a ferroelectric film on an activation region, wherein the activation region extends in a first direction on a semiconductor substrate;
      a first source region or a first drain region in the activation region; and
      a first gate electrode on the ferroelectric film, wherein the first gate electrode extends in a second direction orthogonal to the first direction; and
   a second transistor including:
      an activation layer on the first gate electrode;
      a second source region or a second drain region in the activation layer;
      an insulating film on the activation layer; and
      a second gate electrode on the activation layer via the insulating film.

14. A semiconductor storage apparatus, comprising:
a first transistor including:
   a ferroelectric film on an activation region, wherein the activation region extends in a first direction on a semiconductor substrate;

a first source region or a first drain region in the activation region; and a first gate electrode on the ferroelectric film, wherein the first gate electrode extends in a second direction orthogonal to the first direction; and a second transistor including:

an activation layer on the first gate electrode;

a second source region or a second drain region in the activation layer;

an insulating film on the activation layer; and a second gate electrode on the activation layer via the insulating film, wherein the second gate electrode extends in the first direction.

* * * * *